(12) United States Patent
Liu et al.

(10) Patent No.: US 9,024,693 B2
(45) Date of Patent: May 5, 2015

(54) CRYSTAL-LESS CLOCK GENERATOR AND OPERATION METHOD THEREOF

(71) Applicant: Industrial Technology Research Institute, Hsinchu (TW)

(72) Inventors: Jen-Chieh Liu, Yilan County (TW); Chi-Yang Chang, Taichung (TW); Yo-Hao Tu, New Taipei (TW); Kuo-Hsing Cheng, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/025,834

(22) Filed: Sep. 13, 2013

(65) Prior Publication Data

US 2014/0361840 A1    Dec. 11, 2014

(30) Foreign Application Priority Data

Jun. 6, 2013 (TW) .............................. 102120125 A

(51) Int. Cl.
*H03L 7/087* (2006.01)
*H03L 7/097* (2006.01)
(Continued)

(52) U.S. Cl.
CPC .................. *H03L 7/06* (2013.01); *H03L 7/087* (2013.01); *H03K 3/0315* (2013.01); *H03B 2201/0208* (2013.01); *H03L 1/00* (2013.01); *H03L 7/097* (2013.01); *H03L 7/0995* (2013.01)

(58) Field of Classification Search
CPC .................... H03B 2201/0208; H03K 3/0315; H03K 5/131; H03K 5/132; H03K 5/135; H03L 1/00; H03L 7/06; H03L 7/08; H03L 7/085; H03L 7/087; H03L 7/093; H03L 7/097; H03L 7/0995

USPC ................. 327/146, 147, 155, 156; 331/1 R, 331/16–18, 44, 46–48, 57, 175, 176, 177 V; 375/371, 373–376
See application file for complete search history.

(56) References Cited

U.S. PATENT DOCUMENTS 6,204,694 B1 * 3/2001 Sunter et al. .................... 326/93
6,348,823 B1    2/2002 Pan
(Continued)

FOREIGN PATENT DOCUMENTS

CN           1277353 C    9/2006
CN         101291143 B    5/2010
(Continued)

OTHER PUBLICATIONS

V. D. Smedt et al., "A 66 μW 86 ppm/° C Fully-Integrated 6 MHz Wienbridge Oscillator With a 172 dB Phase Noise FOM," IEEE Journal of Solid-State Circuits, vol. 44, No. 7, Jul. 2009, pp. 1990-2001.
(Continued)

*Primary Examiner* — Levi Gannon
(74) *Attorney, Agent, or Firm* — Jianq Chyun IP Office

(57) ABSTRACT

A crystal-less clock generator (CLCG) and an operation method thereof are provided. The CLCG includes a first oscillation circuit, a second oscillation circuit, and a control circuit. The first oscillation circuit is controlled by a control signal for generating an output clock signal of the CLCG. The second oscillation circuit generates a reference clock signal. The control circuit is coupled to the first oscillation circuit for receiving the output clock signal and coupled to the second oscillation circuit for receiving the reference clock signal. The control circuit is used to generate the control signal for the first oscillation circuit according to the relationship between the output clock signal and the reference clock signal.

31 Claims, 15 Drawing Sheets

(51) Int. Cl.
*H03K 3/03* (2006.01)
*H03L 1/00* (2006.01)
*H03L 7/06* (2006.01)
*H03L 7/099* (2006.01)

(56) References Cited

U.S. PATENT DOCUMENTS

| | | | |
|---|---|---|---|
| 6,473,607 | B1 | 10/2002 | Shohara et al. |
| 6,798,296 | B2 | 9/2004 | Lin et al. |
| 6,963,250 | B2 * | 11/2005 | Ngo et al. ............ 331/57 |
| 7,061,334 | B1 * | 6/2006 | Baig et al. ............ 331/57 |
| 7,084,676 | B2 | 8/2006 | Harron et al. |
| 7,227,424 | B2 | 6/2007 | McCorquodale et al. |
| 7,248,124 | B2 | 7/2007 | McCorquodale et al. |
| 7,292,110 | B2 * | 11/2007 | Lee ................... 331/44 |
| 7,411,466 | B2 | 8/2008 | Alford |
| 7,456,699 | B2 | 11/2008 | McCorquodale et al. |
| 7,535,309 | B2 | 5/2009 | Maher |
| 7,548,125 | B2 | 6/2009 | Carichner et al. |
| 7,548,132 | B2 | 6/2009 | McCorquodale et al. |
| 7,671,688 | B2 | 3/2010 | Marques |
| 7,705,652 | B2 | 4/2010 | Jang |
| 7,764,102 | B2 | 7/2010 | Pacha et al. |
| 7,764,128 | B2 | 7/2010 | Kuo |
| 7,764,132 | B2 | 7/2010 | Jacobowitz et al. |
| 7,924,193 | B2 * | 4/2011 | Lin et al. ............ 341/143 |
| 8,050,376 | B2 | 11/2011 | Liu et al. |
| 8,058,917 | B2 * | 11/2011 | Mayer et al. ............ 327/158 |
| 8,130,048 | B2 * | 3/2012 | Kobayashi ............ 331/57 |
| 8,149,022 | B2 | 4/2012 | Wang |
| 8,193,870 | B2 | 6/2012 | Takinami et al. |
| 8,570,107 | B2 * | 10/2013 | Guo et al. ............ 331/11 |
| 8,686,771 | B2 * | 4/2014 | Frantzeskakis et al. ...... 327/159 |
| 8,754,793 | B2 * | 6/2014 | Henzler ............ 341/120 |
| 8,816,778 | B2 * | 8/2014 | Bracmard et al. ............ 331/2 |
| 8,824,615 | B2 * | 9/2014 | Lin et al. ............ 375/373 |
| 2006/0176097 | A1 | 8/2006 | Bracamontes del Toro |
| 2008/0238518 | A1 | 10/2008 | Guo et al. |
| 2008/0284532 | A1 | 11/2008 | Bakker |
| 2009/0278617 | A1 | 11/2009 | Lee et al. |
| 2012/0013407 | A1 | 1/2012 | Takinami et al. |
| 2013/0010909 | A1 | 1/2013 | Huang et al. |
| 2013/0335148 | A1 * | 12/2013 | Kousai et al. ............ 331/2 |

FOREIGN PATENT DOCUMENTS

| | | |
|---|---|---|
| CN | 101399504 B | 5/2011 |
| CN | 101640534 B | 9/2011 |
| CN | 102739246 A | 10/2012 |
| CN | 102769430 A | 11/2012 |
| EP | 1189351 B1 | 10/2006 |
| JP | 56020337 | 2/1981 |
| TW | 359936 | 6/1999 |
| TW | 540066 | 7/2003 |
| TW | I350658 | 10/2011 |
| TW | 201245924 | 11/2012 |
| WO | 0180238 A1 | 10/2001 |

OTHER PUBLICATIONS

S. M. Kashmiri et al., "A Thermal-Diffusivity-Based Frequency Reference in Standard CMOS With an Absolute Inaccuracy of = 0.1% from 55° C to 125° C," IEEE Journal of Solid-State Circuits, vol. 45, No. 12, Dec. 2010, pp. 2510-2020.

Fabio Sebastiano et al., "A low-voltage mobility-based frequency reference for crystal-Less ULP radios," IEEE Journal of Solid-State Circuits, vol. 44, No. 7, Jul. 2009, pp. 2002-2009.

Sung et al., "A Frequency Accuracy Enhanced Sub-10μW On-Chip Clock Generator for Energy Efficient Crystal-Less Wireless Biotelemetry Applications," IEEE Symposium on VLSI Circuits (VLSIC), Jun. 16-18, 2010, pp. 15-16.

M. S. McCorquodale et al., "A Monolithic and Self-Referenced RF LC Clock Generator Compliant With USB 2.0," IEEE Journal of Solid-State Circuits, vol. 42, No. 2, Feb. 2007, pp. 385-399.

Liu et al., "A 0.3-V All Digital Crystal-less Clock Generator for Energy Harvester Applications," IEEE Asian Solid State Circuits Conference (A-SSCC), Nov. 12-14, 2012 , pp. 117-120.

Y. Tokunaga et al., "An On-Chip CMOS Relaxation Oscillator With Voltage Averaging Feedback," IEEE Journal of Solid-State Circuits, vol. 45, No. 6, Jun. 2010, pp. 1150-1158.

U. Denier, "Analysis and Design of an Ultralow-Power CMOS Relaxation Oscillator," IEEE Transactions on Circuits and Systems, vol. 57, No. 8, Aug. 2010, pp. 1973-1982.

Fabio Sebastiano et al., "A 65-nm CMOS Temperature-Compensated Mobility-Based Frequency Reference for Wireless Sensor Networks," IEEE Journal of Solid-State Circuits, vol. 46, No. 7, Jul. 2011, pp. 1544-1552.

Huang et al., "All-digital PLL using bulk-controlled varactor and pulse-based digitally controlled oscillator," Analog Integr Circ Sig Process, May 15, 2011, pp. 245-255.

J. A. Tierno et al., "A Wide Power Supply Range, Wide Tuning Range, All Static CMOS All Digital PLL in 65 nm SOI," IEEE Journal of Solid-State Circuits, vol. 43, No. 1, Jan. 2008, pp. 42-51.

Chung et al., "A Referenceless All-Digital Fast Frequency Acquisition Full-Rate CDR Circuit for USB 2.0 in 65nm CMOS Technology," International Symposium on VLSI Design, Automation and Test (VLSI-DAT), Apr. 25-28, 2011, pp. 1-4.

Chen et al., "A 2.4 GHz Reference-Less Receiver for 1 Mbps QPSK Demodulation," IEEE Transactions on Circuits and Systems, vol. 59, No. 6, Mar. 2012, pp. 505-514.

Han et al, "Analysis of a Frequency Acquisition Technique With a Stochastic Reference Clock Generator," IEEE Transactions on Circuits and Systems, vol. 59, No. 6, Jun. 2012, pp. 336-340.

Rajesh Inti, "Highly Digital Power Efficient Techniques for Serial Links," Doctor's thesis, Nov. 28, 2011, The Graduate School, College of Electrical and Computer Engineering, The Oregon State University.

Sung et al., "A Robust Frequency Tracking Loop for Energy-Efficient Crystalless WBAN Systems," IEEE Transactions on Circuits and Systems, vol. 58, No. 10, Oct. 2011, pp. 637-641.

Wenjing Yin, "Design Techniques for High-Performance Digital PLLs and CDRs," Doctor's thesis, Oct. 20, 2010, The Graduate School, College of Electrical and Computer Engineering, The Oregon State University.

B. Casper et al., "Clocking Analysis, Implementation and Measurement Techniques for High-Speed Data Link—A Tutorial," IEEE Transactions on Circuits and Systems, vol. 56, No. 1, Jan. 2009, pp. 17-39.

Dianyong Chen, "SerDes Transceivers for High-speed Serial Communications"(http://www.doe.carleton.ca/~ddchen/publications/serdes.pdf), Jan. 2, 2008, pp. 1-31.

Shanfeng Cheng, "Design of CMOS Integrated Phase-Locked Loops for Multi-Gigabits Serial Data Links," Doctor's thesis, Dec. 2006, The Graduate School, College of Electrical Engineering, The Texas A&M University.

Jue-Hao You, "Clock Multiplier Unit and Data/Clock Recovery for OC-192 Transceiver," Masterr's thesis, Jun. 2003, Department of Electrical Engineering, National Central University.

L. Aaltonen et al., "2011 Index IEEE Journal of Solid-State Circuits vol. 46," IEEE Transactions on Circuits and Systems, vol. 46, No. 12, Dec. 2011, pp. 3175-3216.

J. Lee and S. H. Cho, "A 10 MHz 80μW 67 ppm / °C CMOS Reference Clock Oscillator with a Temperature Compensated Feedback Loop in 0.18μm CMOS," Symposium on VLSI Circuits Digest of Technical Papers, Jun. 16-18, 2009, pp. 226-227.

S. L. J. Gierkink and Ed (A. J. M.) van Tuijl, "A Coupled Sawtooth Oscillator Combining Low Jitter With High Control Linearity," IEEE Journal of Solid-State Circuits, vol. 37, No. 6, Jun. 2002, pp. 702-710.

* cited by examiner

CRYSTAL-LESS CLOCK GENERATOR AND OPERATION METHOD THEREOF

CROSS-REFERENCE TO RELATED APPLICATION

This application claims the priority benefit of Taiwan application serial no. 102120125, filed on Jun. 6, 2013. The entirety of the above-mentioned patent application is hereby incorporated by reference herein and made a part of this specification.

TECHNICAL FIELD

The technical field relates to a crystal-less clock generator (CLCG) and an operation method thereof.

BACKGROUND

Along with the development of electronic systems, the sizes of different electronic elements have been constantly reduced, and the number of transistors per unit area in a chip has been increased accordingly. Modularizing all circuits in a product and integrating the functions of these modules into a single chip is one of the trends in the future development of electronic systems. Clock signal perform synchronization in various electronic systems. In a portable electronic device or an electronic biomedical product, a clock source with low power consumption and small surface area may extend the lifespan of the product. Presently, a clock signal is usually generated using a crystal oscillator, micro electro mechanical systems (MEMS), or through a CMOS process. The frequency of a crystal oscillator or MEMS is stable at different temperatures and voltages. As to the circuit system structure, an oscillating circuit realized through a CMOS process possesses integration superiority over oscillating circuits realized through other techniques.

Existing CMOS oscillators come in three types of main structures. The first type of main structure adopts a LC oscillator for high-frequency system operations. The second type of main structure adopts a relaxation oscillator, in which the frequency oscillation is controlled by charging/discharging loads including at least a resistor and/or at least a capacitor. The third type of main structure is an all-digital oscillating structure, in which a digital signal processor and a clock generator are integrated into a single chip so that the system area is effectively reduced. Because the frequency stability of a CMOS circuit is sensitive to temperature, how to respond to an environmental variation in a CMOS structure is a subject to be resolved.

SUMMARY

Accordingly, the present disclosure is directed to a crystal-less clock generator (CLCG) and an operation method thereof, in which an output frequency is automatically calibrated.

The present disclosure provides a CLCG including a first oscillation circuit, a second oscillation circuit, and a control circuit. The first oscillation circuit is controlled by a control signal for generating an output clock signal of the CLCG. The second oscillation circuit generates a reference clock signal. The control circuit is coupled to the first oscillation circuit for receiving the output clock signal and coupled to the second oscillation circuit for receiving the reference clock signal. The control circuit is used to generate the control signal for the first oscillation circuit according to the relationship between the output clock signal and the reference clock signal.

The present disclosure provides an operation method of a CLCG. The operation method includes following steps. An output clock signal of the CLCG is generated by a first oscillation circuit according to a control signal. A reference clock signal is generated by a second oscillation circuit. The control signal is generated for the first oscillation circuit according to the relationship between the output clock signal and the reference clock signal.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, explain the principles of the disclosure.

DETAILED DESCRIPTION OF DISCLOSED EMBODIMENTS

Figure 1:
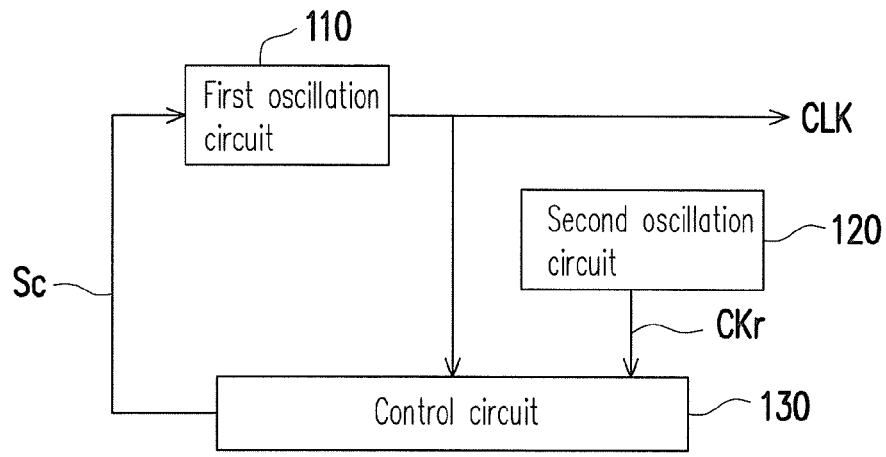
FIG. 1 is a circuit block diagram of a crystal-less clock generator (CLCG) according to an embodiment of the present disclosure.

The term "couple" used throughout the present disclosure (including the claims) can refer to any direct or indirect connection. For example, if a first device is described as being coupled to a second device, the first device can be directly connected to the second device or indirectly connected to the second device through any other device or any connection technique. In addition, wherever possible, same or similar devices/elements/steps are referred to with same reference numerals throughout the present disclosure and accompanying drawings. Devices/elements/steps with the same reference numerals or terms in different embodiments can be referred to each other.

FIG. 1 is a circuit block diagram of a crystal-less clock generator (CLCG) 100 according to an embodiment of the present disclosure. The CLCG 100 can be implemented in an all-digital manner. The CLCG 100 can operate at a high speed with a low voltage supply (for example, 0.5 V), and the CLCG 100 offers a compensation function for environmental variations. The CLCG 100 can be applied to any electronic system, such as a printer, a photocopier, a liquid crystal screen, a CD-ROM, a radio frequency (RF) related transceiving circuit, a digital biomedical chip integrated system, or any other portable electronic device.

Figure 2:
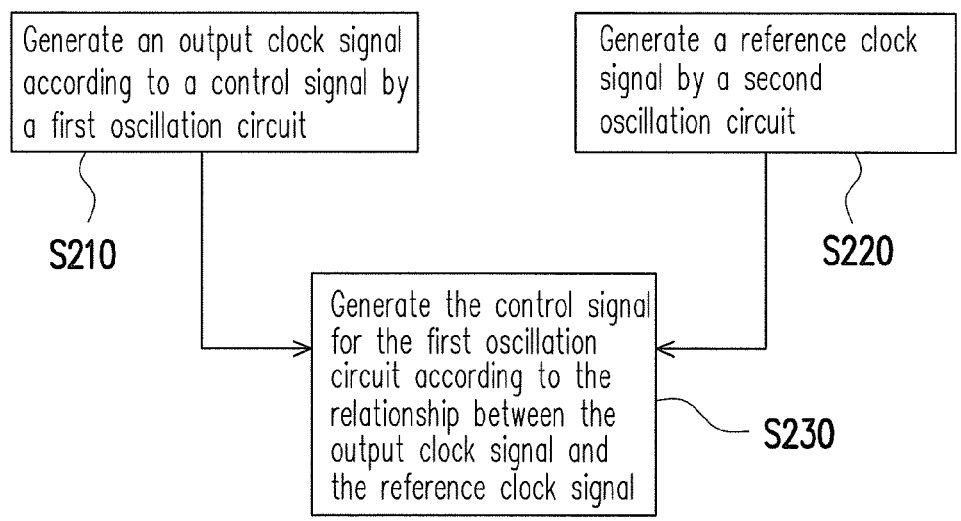
FIG. 2 is a flowchart of an operation method of a CLCG according to an embodiment of the present disclosure.

FIG. 2 is a flowchart of an operation method of a CLCG according to an embodiment of the present disclosure. Referring to FIG. 1 and FIG. 2, the CLCG 100 includes a first oscillation circuit 110, a second oscillation circuit 120, and a control circuit 130. The first oscillation circuit 110 is controlled by a control signal Sc, and in step S210, the first oscillation circuit 110 generates an output clock signal CLK of the CLCG 100 according to the control signal Sc. The output clock signal CLK can be a single-phase clock signal or a multi-phase clock signal. A multi-phase clock signal can be applied broadly, such as being provided to a clock and data recovery (CDR) circuit in high-speed serial data transmission or being used for clock synthesis in a frequency multiplication application.

Figure 3:
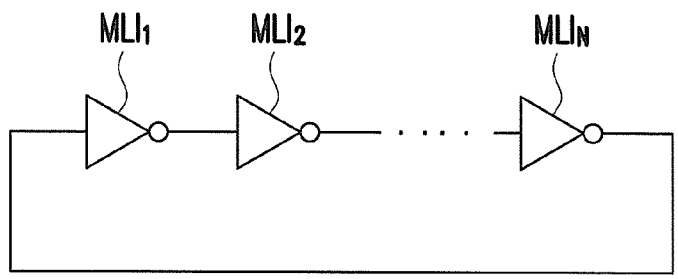
FIG. 3 is a circuit block diagram of a first oscillation circuit in FIG. 1 according to an embodiment of the present disclosure.

The first oscillation circuit 110 includes a digital controlled oscillator (DCO) or any other controllable oscillation circuit. FIG. 3 is a circuit block diagram of the first oscillation circuit 110 in FIG. 1 according to an embodiment of the present disclosure. Referring to FIG. 1 and FIG. 3, the first oscillation circuit 110 includes a main loop. The main loop includes N main loop inverters $MLI_1$, $MLI_2$, ..., and $MLI_N$ that are serially connected with each other, wherein N is an integer. As shown in FIG. 3, the input terminal of the main loop inverter $MLI_1$ is coupled to the output terminal of the main loop inverter $MLI_N$, and the input terminal of the main loop inverter $MLI_i$ is coupled to the output terminal of the main loop inverter $MLI_{i-1}$, wherein i is an integer between 1 and N.

At least one (or multiple) of the main loop inverters $MLI_1$-$MLI_N$ is controlled by the control signal Sc. For example, the control signal Sc controls the delay time or driving current of the main loop inverter $MLI_1$ and/or other main loop inverters. The output terminal of one (or more) of the main loop inverters $MLI_1$-$MLI_N$ generates a single clock signal (or multiple clock signals having different phases) as the output clock signal CLK of the CLCG 100. Thus, the first oscillation circuit 110 can generate a single-phase or a multi-phase output clock signal CLK, and can adjust the frequency of the output clock signal CLK according to the control signal Sc.

Figure 4:
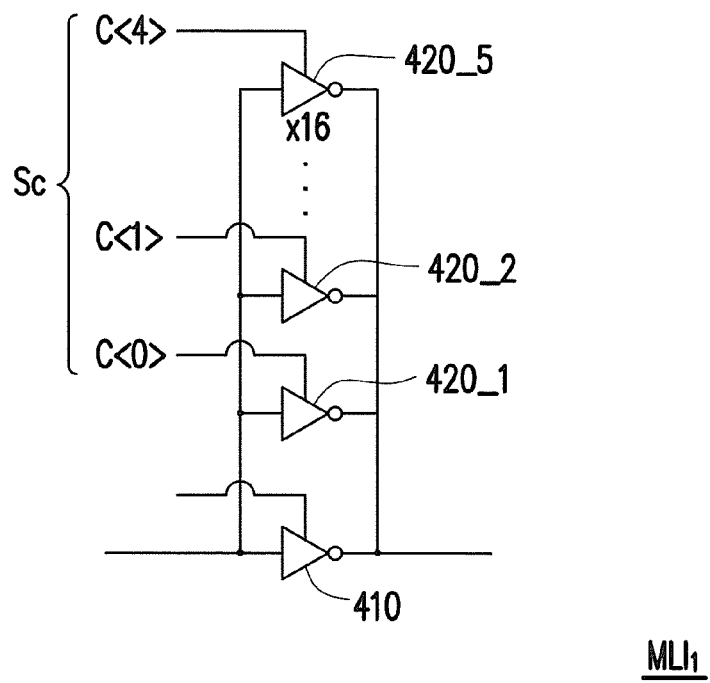
FIG. 4 is a circuit block diagram of a main loop inverter in FIG. 3 according to an embodiment of the present disclosure.

In the present embodiment, these main loop inverters $MLI_1$-$MLI_N$ can be implemented through any technique. Taking the main loop inverter $MLI_1$ as an example, FIG. 4 is a circuit block diagram of the main loop inverter $MLI_1$ in FIG. 3 according to an embodiment of the present disclosure, and the rest main loop inverters can be implemented by referring to descriptions related to the main loop inverter $MLI_1$. Referring to FIG. 4, the main loop inverter $MLI_1$ includes a first inverter 410 and a plurality of second inverters. Herein five second inverters 420_1, 420_2, ..., and 420_5 are taken as examples, but the number of the second inverters is not limited in other embodiments. The sizes of the second inverters 420_1-420_5 are different from each other. For example, the size of the second inverter 420_2 is twice that of the second inverter 420_1, and the size of the second inverter 420_5 is 16 times of that of the second inverter 420_1. The driving current of an inverter increases with the size of the inverter.

The first inverter 410 and the second inverters 420_1-420_5 are connected with each other in parallel, as shown in FIG. 4. The second inverters 420_1-420_5 may be tri-invs. In the present embodiment, the control signal Sc includes bits C<0>, C<1>, ..., and C<4>. These bits C<0>-C<4> respectively determine the operation states of the second inverters 420_1-420_5. The bits C<0>-C<4> of the control signal Sc are used for controlling the on/off of the tri-invs. For example, when the bit C<0> is logic 0, the second inverter 420_1 is disabled, and when the bit C<0> is logic 1, the second inverter 420_1 is enabled. Larger value of the control signal Sc results in larger driving currents of the second inverters 420_1-420_5. In other words, larger value of the control signal Sc results in larger the equivalent size of the main loop inverter $MLI_1$, and accordingly the output driving current increase. Thus, the control signal Sc can determine the driving current of the main loop inverter $MLI_1$. When the driving currents of the main loop inverters increase, the output frequency of the first oscillation circuit 110 in FIG. 3 increases accordingly.

Figure 5:
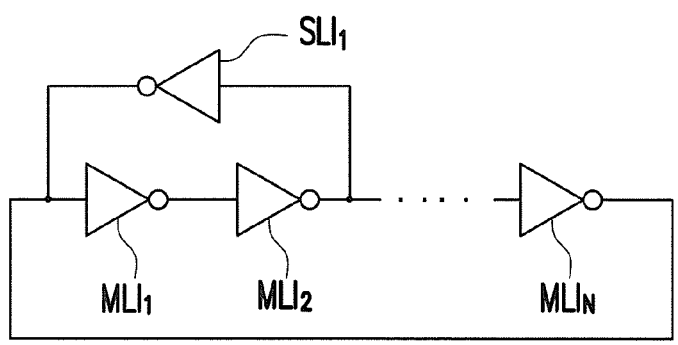
FIG. 5 is a circuit block diagram of the first oscillation circuit in FIG. 1 according to another embodiment of the present disclosure.

FIG. 5 is a circuit block diagram of the first oscillation circuit 110 in FIG. 1 according to another embodiment of the present disclosure. The embodiment illustrated in FIG. 5 can be referred to descriptions related to FIG. 3. Referring to FIG. 1 and FIG. 5, besides the main loop inverters $MLI_1$-$MLI_N$, the first oscillation circuit 110 further includes at least one secondary loop inverter, such as the secondary loop inverter $SLI_1$ in FIG. 5. The secondary loop inverter $SLI_1$ can be implemented with any technique. In the present embodiment, the implementation of the secondary loop inverter $SLI_1$ can be referred to descriptions related to FIG. 4. The secondary loop inverter $SLI_1$ may be controlled by the control signal Sc to adjust the output frequency of the first oscillation circuit 110.

The input terminal of the secondary loop inverter $SLI_1$ is coupled to the output terminal of the main loop inverter $MLI_2$, and the output terminal of the secondary loop inverter $SLI_1$ is coupled to the input terminal of the main loop inverter $MLI_1$, as shown in FIG. 5. The output terminal of the main loop inverter $MLI_1$ is coupled to the input terminal of the main loop inverter $MLI_2$. Thus, the serially connected main loop inverter $MLI_1$, main loop inverter $MLI_2$, and secondary loop inverter $SLI_1$ constitute a secondary loop.

Figure 6:
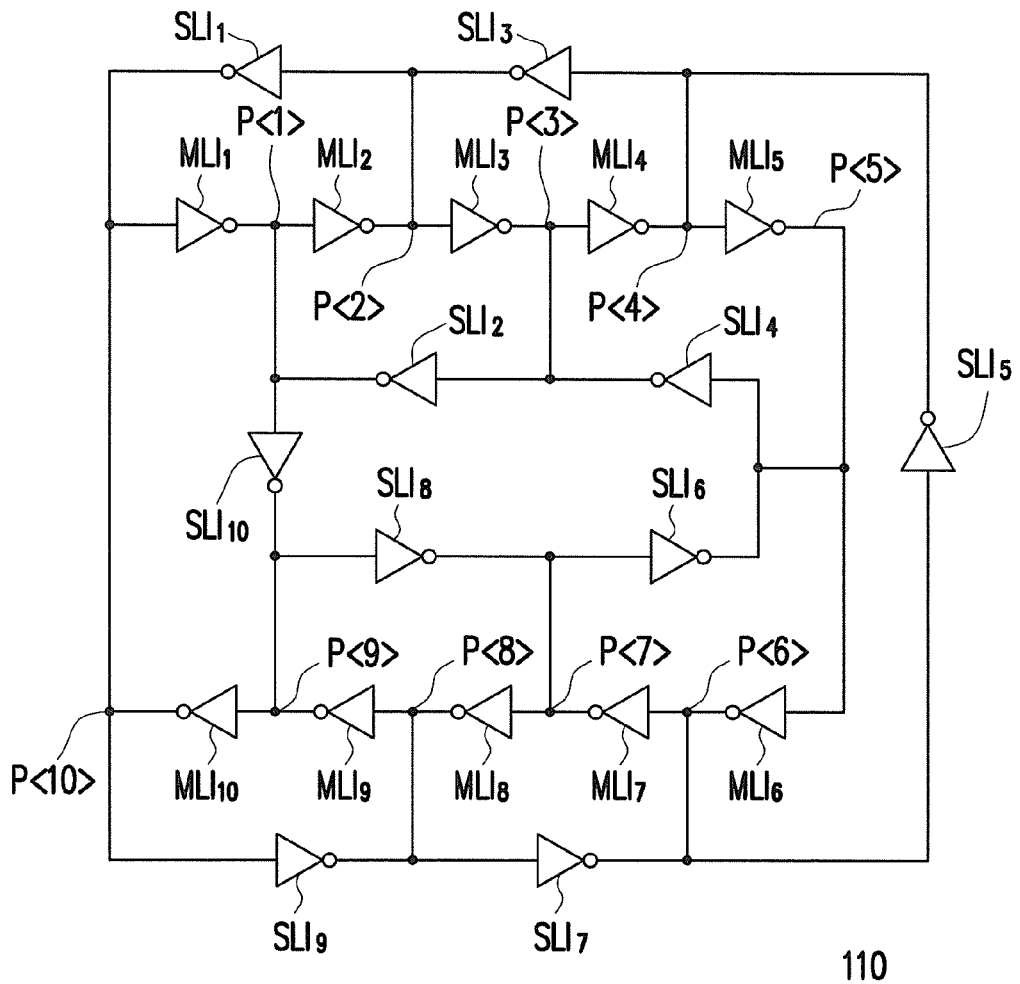
FIG. 6 is a circuit block diagram of the first oscillation circuit in FIG. 1 according to yet another embodiment of the present disclosure.

FIG. 6 is a circuit block diagram of the first oscillation circuit 110 in FIG. 1 according to yet another embodiment of the present disclosure. The embodiment illustrated in FIG. 6 can be referred to descriptions related to FIG. 3 or FIG. 5. In the embodiment illustrated in FIG. 6, the first oscillation circuit 110 is implemented by using a ten-stage ring oscillator (including 10 main loop inverters $MLI_1$-$MLI_{10}$) to generate a ten-phase output (i.e., the outputs of the main loop inverters $MLI_1$-$MLI_{10}$). The clock signal generated by the output terminal of one (or more) of the main loop inverters $MLI_1$-$MLI_{10}$ can be the output clock signal CLK of the CLCG 100. In other embodiments, different number of stages of the ring oscillator in the first oscillation circuit 110 of FIG. 6 can be implemented by analogy with descriptions related to FIG. 6.

Referring to FIG. 1 and FIG. 6, besides the main loop inverters $MLI_1$-$MLI_{10}$, the first oscillation circuit 110 further includes 10 secondary loop inverters $SLI_1$-$SLI_{10}$. The input terminal of the secondary loop inverter SLI; is coupled to the output terminal P<i+1> of the main loop inverter $MLI_{i+1}$, and the output terminal of the secondary loop inverter $SLI_i$ is coupled to the input terminal of the main loop inverter $MLI_i$ (i.e., the output terminal P<i−1> of the main loop inverter $MLI_{i-1}$), wherein i is an integer. For example, the input terminal of the secondary loop inverter $SLI_3$ is coupled to the output terminal P<4> of the main loop inverter $MLI_4$, and the output terminal of the secondary loop inverter $SLI_3$ is coupled to the input terminal of the main loop inverter $MLI_3$ (i.e., the output terminal P<2> of the main loop inverter $MLI_2$). The secondary loop inverters $SLI_1$-$SLI_{10}$ can be implemented with any technique. In the present embodiment, the implementation of the secondary loop inverters $SLI_1$-$SLI_{10}$ can be referred to descriptions related to FIG. 4. The main loop inverters $MLI_1$-$MLI_{10}$ and the secondary loop inverters $SLI_1$-$SLI_{10}$ may be controlled by the control signal Sc to adjust the output frequency of the first oscillation circuit 110. The operating frequency of the first oscillation circuit 110 in FIG. 6 does not decrease severely with the increase of the stage number.

In another embodiment, the control signal Sc includes a coarse-tuning signal C (for example, the bits C<0>-C<4> in FIG. 4) and a fine-tuning signal F, and the first oscillation circuit 110 further includes at least one varactor $VC_i$. The at least one varactor $VC_i$ is coupled to the output terminal of one of the main loop inverters $MLI_1$-$MLI_{10}$ (for example, to the output terminal P<i> of the $i^{th}$ main loop inverter $MLI_i$). The at least one varactor $VC_i$ is controlled by the fine-tuning signal F. The number of the at least one varactor $VC_i$ can be determined according to the actual design requirement. For example, 10 varactors $VC_1$-$VC_{10}$ (not shown) are disposed in the first oscillation circuit 110 illustrated in FIG. 6, where the varactors $VC_1$-$VC_{10}$ are respectively coupled to the output terminals P<1>-P<10> of the main loop inverters $MLI_1$-$MLI_{10}$.

Figure 7:
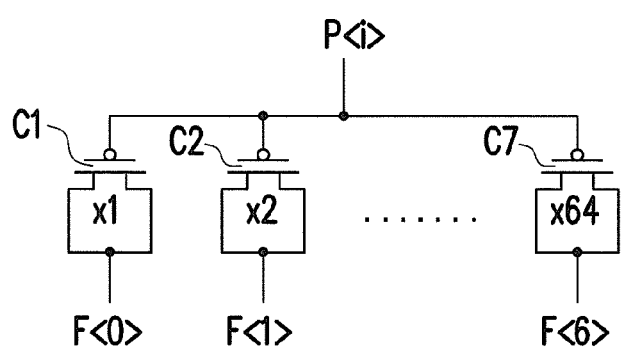
FIG. 7 is a circuit diagram of a varactor according to an embodiment of the present disclosure.

The at least one varactor $VC_i$ can be implemented with any technique. FIG. 7 is a circuit diagram of a varactor $VC_i$ according to an embodiment of the present disclosure. The varactor $VC_i$ includes a plurality of metal-oxide semiconductor (MOS) capacitors. Herein it is assumed that the varactor $VC_i$ includes 7 MOS capacitors C1, C2, . . . , and C7. However, the number of the MOS capacitors is not limited in other embodiments. The sizes of the MOS capacitors C1-C7 are different from each other. For example, the size of the MOS capacitor C2 is twice that of the MOS capacitor C1, and the size of the MOS capacitor C7 is 64 times of that of the MOS capacitor C1. The first ends of the MOS capacitors C1-C7 are all coupled to the output terminal P<i> of the $i^{th}$ main loop inverter $MLI_i$ in the first oscillation circuit 110 illustrated in FIG. 6. The second ends of the MOS capacitors C1-C7 respectively receive the bits F<0>, F<1>, . . . , and F<6> in the fine-tuning signal F of the control signal Sc. Thus, the varactor $VC_i$ is controlled by the fine-tuning signal F of the control signal Sc. Referring to FIG. 6 and FIG. 7, the main loop inverters $MLI_1$-$MLI_{10}$ and the secondary loop inverters $SLI_1$-$SLI_{10}$ are controlled by the bits C<0>-C<4> of the control signal Sc to perform coarse frequency tuning, and the varactor $VC_i$ is controlled by the bits F<0>-F<6> of the control signal Sc to perform fine frequency tuning, so that high-resolution frequency adjustment can be accomplished.

Referring to FIG. 1, the second oscillation circuit 120 generates a reference clock signal CKr in step S220. In some embodiments, the circuit structure of the second oscillation circuit 120 is the same as that of the first oscillation circuit 110. In other embodiments, the second oscillation circuit 120 includes a ring oscillator for generating the reference clock signal CKr.

The control circuit 130 is coupled to the first oscillation circuit 110 to receive the output clock signal CLK and is coupled to the second oscillation circuit 120 to receive the reference clock signal CKr. In step S230, the control circuit 130 generates the control signal Sc for the first oscillation circuit 110 according to the relationship between the output clock signal CLK and the reference clock signal CKr to correct a frequency error/accuracy of the output clock signal CLK caused by an environmental variation. The environmental variation includes a temperature variation, a voltage variation, a process variation, or a variation in any other environmental condition. Regarding voltage variation, process drift, and temperature variation, the control circuit 130 can compensate for the operating frequency of the first oscillation circuit 110. When a temperature variation causes the frequency of the output clock signal CLK to drift, the control circuit 130 can compensate for the frequency by a compensation mechanism.

As described above, the embodiment of the present disclosure provides a CLCG, in which when frequency drift is caused by an environmental variation (for example, the variation of temperature or any other environmental condition), the frequency of the output clock signal can be automatically adjusted to the target operating frequency.

Figure 8:
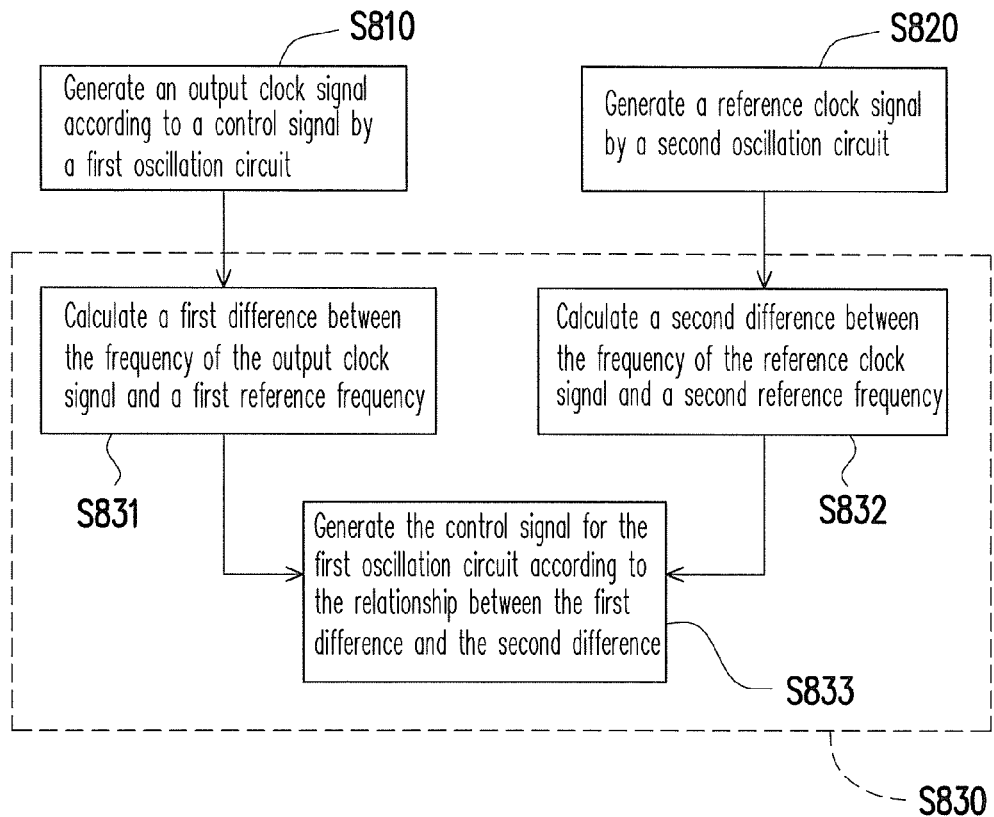
FIG. 8 is a flowchart of an operation method of a CLCG according to another embodiment of the present disclosure.

FIG. 8 is a flowchart of an operation method of a CLCG according to another embodiment of the present disclosure. Steps S810, S820, and S830 in FIG. 8 can be referred to steps S210, S220, and S230 in FIG. 2. In the embodiment illustrated in FIG. 8, step S830 further includes sub-steps S831, S832, and S833. Referring to FIG. 1 and FIG. 8, in step S831, the control circuit 130 calculates a difference (referred to as a first difference thereinafter) between the frequency of the output clock signal CLK and a first reference frequency, and in step S832, the control circuit 130 calculates a difference (referred to as a second difference thereinafter) between the frequency of the reference clock signal CKr and a second reference frequency.

Aforementioned first reference frequency and second reference frequency can be determined according to the design requirement. For example, the first reference frequency can be the rated output frequency (or target frequency) of the first oscillation circuit 110, and the second reference frequency can be the rated output frequency (or target frequency) of the second oscillation circuit 120. As another example, the control circuit 130 can take the frequency of the output clock signal CLK measured for the first time after the first oscillation circuit 110 is initialized to serve as the first reference frequency, and take the frequency of the reference clock signal CKr measured for the first time after the second oscillation circuit 120 is initialized to serve as the second reference frequency.

In step S833, based on the relationship between the first difference and the second difference, the control circuit 130 generates the control signal Sc for the first oscillation circuit 110 to correct the frequency error/accuracy of the output clock signal CLK caused by the temperature variation. When the temperature of the CLCG 100 changes, the frequency of the output clock signal CLK of the first oscillation circuit 110 and the frequency of the reference clock signal CKr of the second oscillation circuit 120 change with the temperature. During the operation, the control circuit 130 constantly monitors the relationship between the first difference and the second difference and adjusts the control signal Sc accordingly until the first difference is equal to the second difference.

Figure 9:
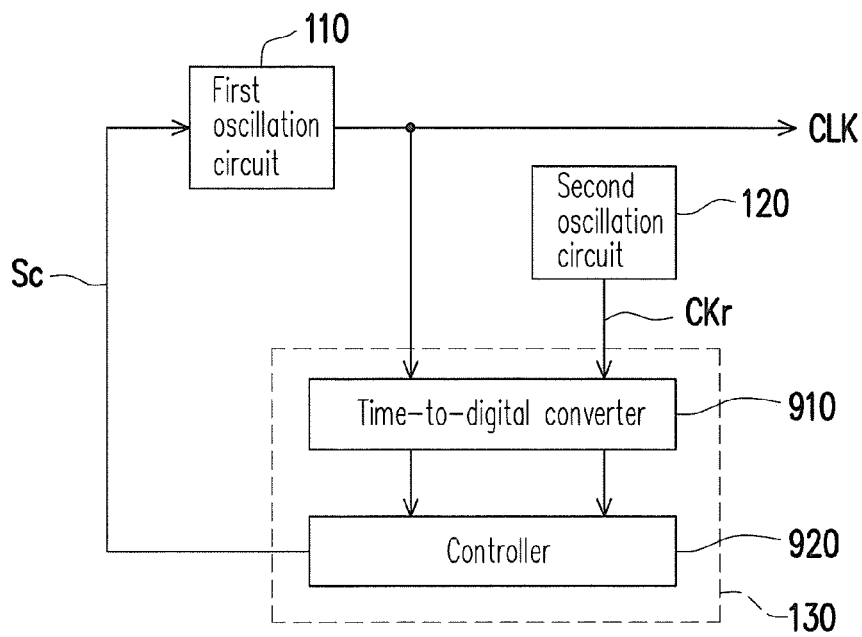
FIG. 9 is a circuit block diagram of a CLCG according to an embodiment of the present disclosure.

FIG. 9 is a circuit block diagram of a CLCG 900 according to an embodiment of the present disclosure. The CLCG 900 illustrated in FIG. 9 can be referred to descriptions related to the CLCG 100 illustrated in FIG. 1. In the embodiment illustrated in FIG. 9, the control circuit 130 includes a time-to-digital converter (TDC) 910 and a controller 920. The TDC 910 is coupled to the first oscillation circuit 110 and the second oscillation circuit 120. The controller 920 is coupled to the output terminal of the TDC 910. The TDC 910 converts time into a digital code and provides the digital code to the controller 920. For example, the TDC 910 converts the period of the output clock signal CLK (or reference clock signal CKr) into a corresponding digital code. Or, when the output clock signal CLK (or reference clock signal CKr) contains two signals of different phases, the TDC 910 may convert the phase difference between the two signals into a corresponding digital code.

Figure 10:
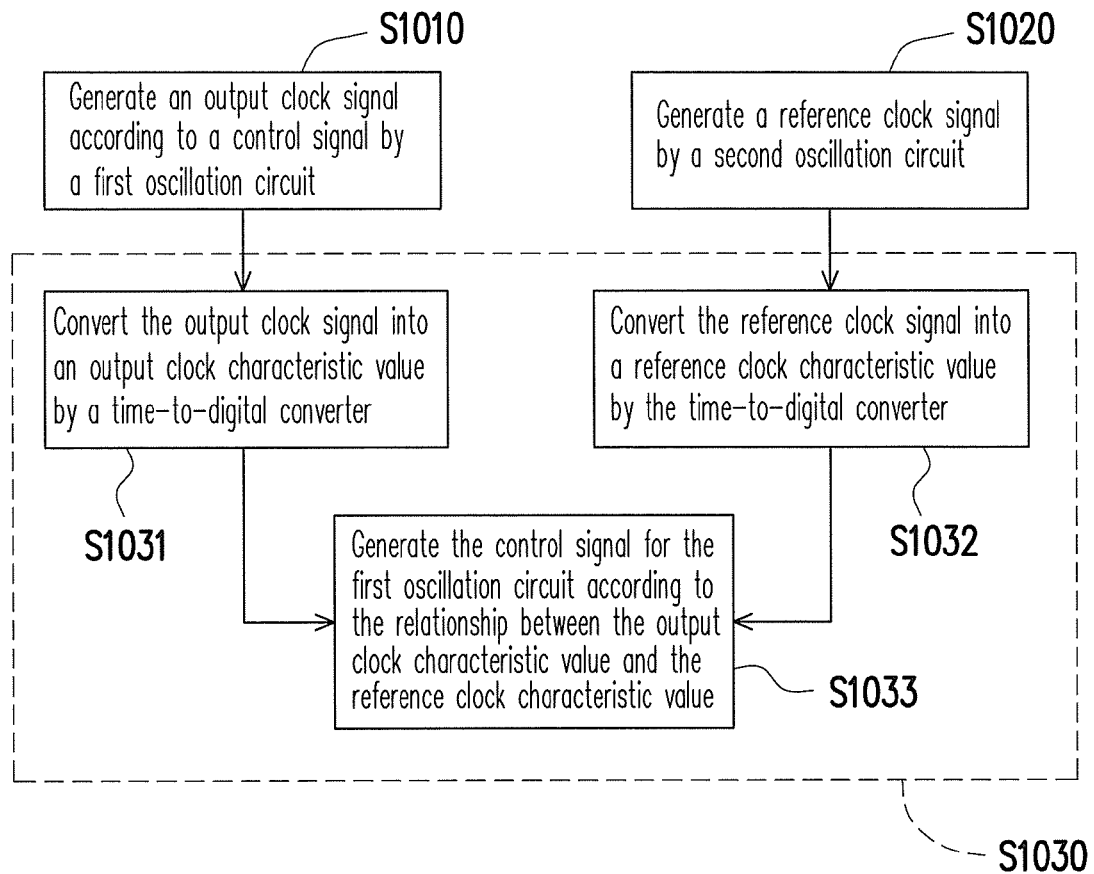
FIG. 10 is a flowchart of an operation method of a CLCG according to yet another embodiment of the present disclosure.

FIG. 10 is a flowchart of an operation method of a CLCG according to yet another embodiment of the present disclosure. Steps S1010, S1020, and S1030 in FIG. 10 can be referred to descriptions related to steps S210, S220, and S230 in FIG. 2. Referring to FIG. 9 and FIG. 10, step S1030 further includes sub-steps S1031, S1032, and S1033. In step S1031, the TDC 910 converts the output clock signal CLK into an output clock characteristic value, and in step S1032, the TDC 910 converts the reference clock signal CKr into a reference clock characteristic value.

Figure 11:
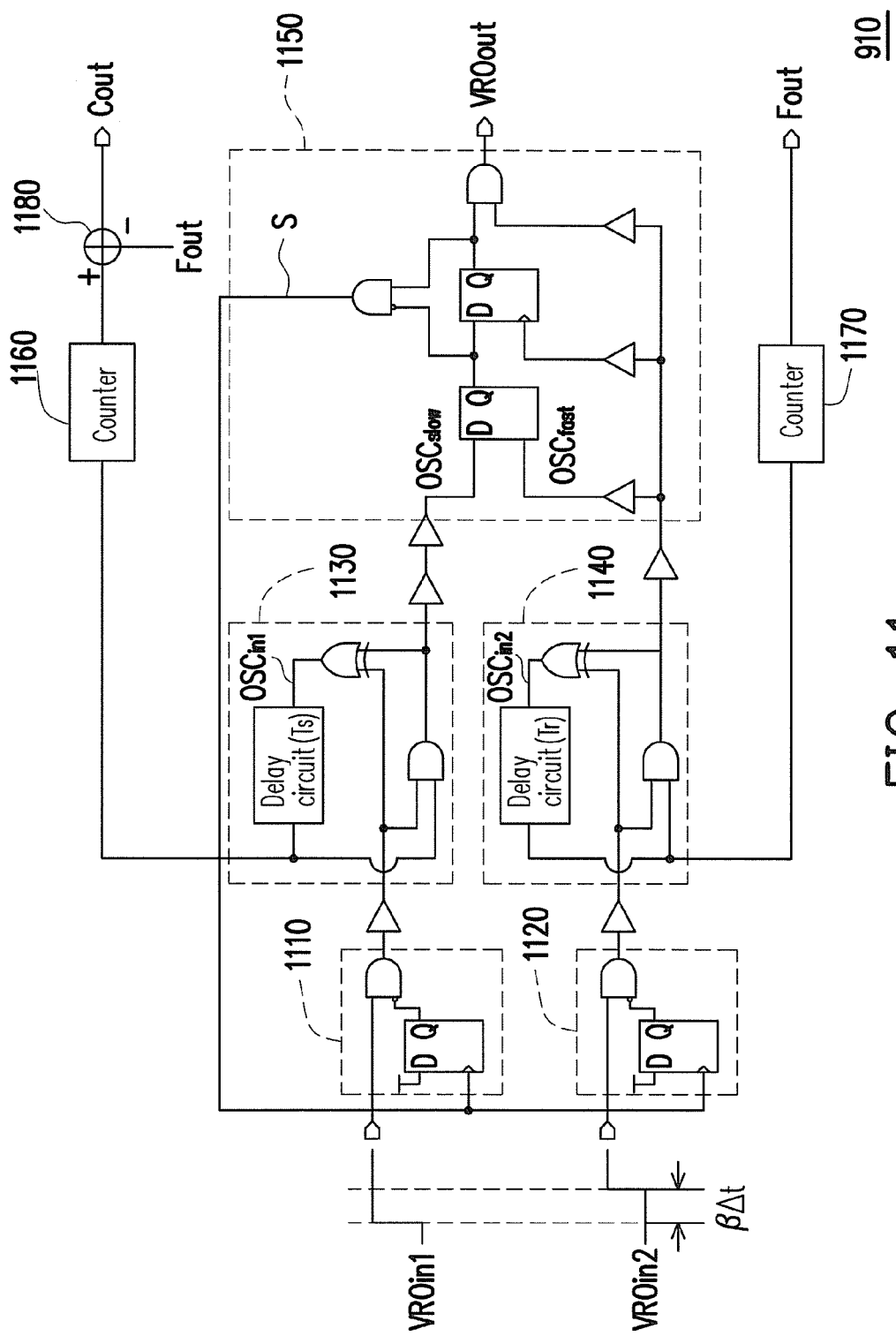
FIG. 11 is a circuit block diagram of a time-to-digital converter according to an embodiment of the present disclosure.

The TDC 910 can be implemented with any technique. FIG. 11 is a circuit block diagram of the TDC 910 according to an embodiment of the present disclosure. To increase the resolution, produce a sufficient measurement range, and obtain a low power consumption and a low cost, the TDC 910 is implemented through a vernier technique. Referring to FIG. 11, the TDC 910 includes a first gate circuit 1110, a second gate circuit 1120, a first vernier oscillator 1130, a second vernier oscillator 1140, a phase detector 1150, a first counter 1160, a second counter 1170, and a subtractor 1180. The output clock signal CLK generated by the first oscillation circuit 110 will be taken as an example to explain how the TDC 910 converts the time of the output clock signal CLK into a digital code in the following description. The conversion of the reference clock signal CKr generated by the second oscillation circuit 120 can be referred to descriptions related to the output clock signal CLK.

In the present embodiment, the output clock signal CLK includes a plurality of clock signals having different phases, where two clock signals are respectively transmitted to the first gate circuit 1110 and the second gate circuit 1120 through the input terminals $VRO_{in1}$ and $VRO_{in2}$ of the TDC 910. The first gate circuit 1110 and the second gate circuit 1120 can enable the first vernier oscillator 1130 and the second vernier oscillator 1140 in a working state. Thus, the first gate circuit 1110 and the second gate circuit 1120 can respectively transmit the clock signals of the input terminals $VRO_{in1}$ and $VRO_{in2}$ to the enabling terminals of the first vernier oscillator 1130 and the second vernier oscillator 1140.

Figure 12:
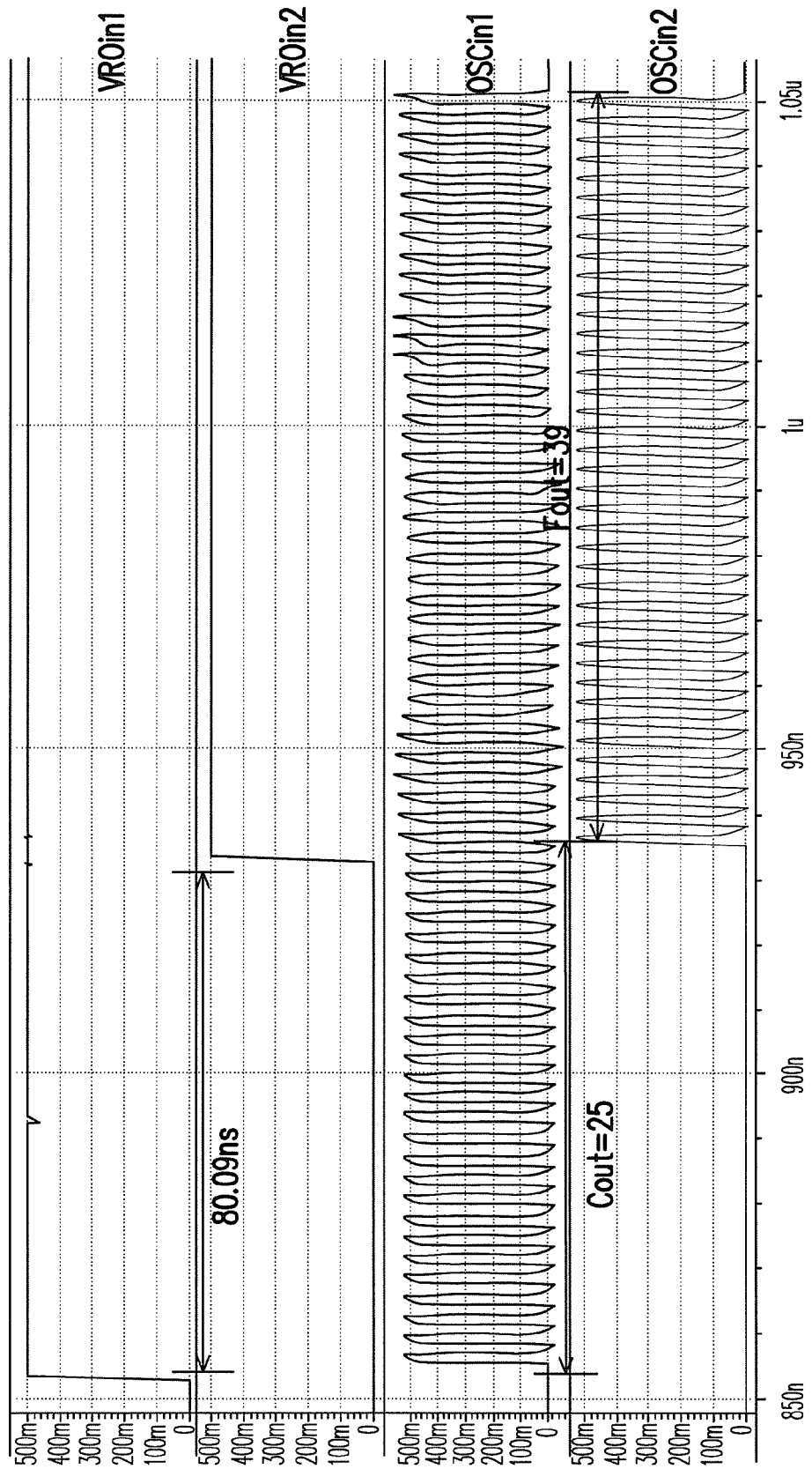
FIG. 12 is a signal timing diagram of the time-to-digital converter in FIG. 11 according to an embodiment of the present disclosure.

FIG. 12 is a signal timing diagram of the TDC 910 in FIG. 11 according to an embodiment of the present disclosure. Referring to FIG. 11 and FIG. 12, the first gate circuit 1110 and the second gate circuit 1120 in the working state respectively transmit the clock signals of the input terminals $VRO_{in1}$ and $VRO_{in2}$ to the enabling terminals of the first vernier oscillator 1130 and the second vernier oscillator 1140. When the signal at the enabling terminal of the first vernier oscillator 1130 is in an enabling state (for example, logic 1), the first vernier oscillator 1130 generates an oscillation signal $OSC_{slow}$ having a frequency Freq1. When the signal at the enabling terminal of the first vernier oscillator 1130 is in a disabling state (for example, logic 0), the oscillation signal $OSC_{slow}$ of the first vernier oscillator 1130 remains at logic 0 (no oscillation). The operation of the second gate circuit 1120 is the same as that of the first vernier oscillator 1130, and the second gate circuit 1120 selectively generates an oscillation signal $OSC_{fast}$ having a frequency Freq2. Herein the oscillation frequency Freq1 of the first vernier oscillator 1130 is different from the oscillation frequency Freq2 of the second gate circuit 1120. For example, the oscillation frequency Freq1 of the first vernier oscillator 1130 is 324.36 MHz, while the oscillation frequency Freq2 of the second gate circuit 1120 is 334.06 MHz.

Two input terminals of the phase detector 1150 are respectively coupled to the output terminals of the first vernier oscillator 1130 and the second vernier oscillator 1140 to receive the oscillation signal $OSC_{slow}$ and the oscillation signal $OSC_{fast}$. The phase detector 1150 detects the phase relationship between the oscillation signal $OSC_{slow}$ and the oscillation signal $OSC_{fast}$ and outputs a detection result $VRO_{out}$. When the rising edge of the oscillation signal $OSC_{slow}$ and the rising edge of the oscillation signal $OSC_{fast}$ are aligned, the phase detector 1150 outputs a gate signal S to the first gate circuit 1110 and the second gate circuit 1120 to change the operation state of the first gate circuit 1110 and the second gate circuit 1120 from the working state to a standby state. In the standby state, the clock signals of the input terminals $VRO_{in1}$ and $VRO_{in2}$ cannot reach to the enabling terminals of the first vernier oscillator 1130 and the second vernier oscillator 1140, so that the first vernier oscillator 1130 and the second vernier oscillator 1140 are disabled.

The second counter 1170 is coupled to the second vernier oscillator 1140. The second counter 1170 counts the number of pulses of the oscillation signal OSCin2 and outputs the counting result as a fine-tuning signal $F_{out}$ of the output clock characteristic value of the output clock signal CLK. The first counter 1160 is coupled to the first vernier oscillator 1130. The first counter 1160 counts the number of pulses of the oscillation signal OSCin1 and outputs the counting result. The subtractor 1180 is coupled to the output terminals of the first counter 1160 and the second counter 1170. The subtractor 1180 calculates the difference between the two counting results and outputs the calculation result as a coarse-tuning signal $C_{out}$ of the output clock characteristic value of the output clock signal CLK. The TDC 910 offers both a coarse tuning function and a fine tuning function such that the measurement range can be greatly broadened without sacrificing the high resolution.

Figure 13:
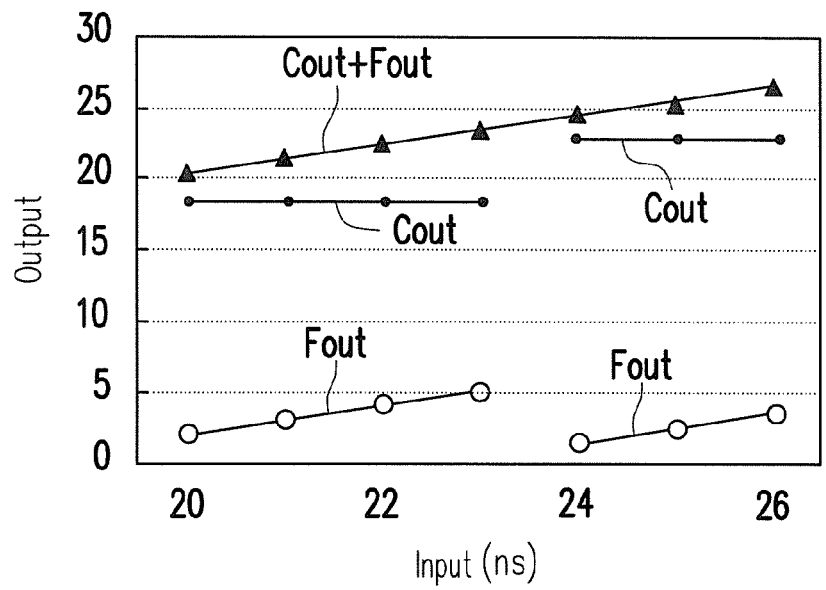
FIG. 13 is an input/output comparison diagram of the time-to-digital converter in FIG. 11 according to an embodiment of the present disclosure.

FIG. 13 is an input/output comparison diagram of the TDC 910 in FIG. 11 according to an embodiment of the present disclosure. In FIG. 13, the abscissa indicates the input (in unit of ns) of the TDC 910, and the ordinate indicates the output (a digital code) of the TDC 910. When the clock signals of the input terminals $VRO_{in1}$ and $VRO_{in2}$ have different time (phases), the TDC 910 outputs a corresponding digital code.

Referring to FIG. 9 and FIG. 10, in step S1033, the controller 920 generates the control signal Sc for the first oscillation circuit 110 according to the relationship between the output clock characteristic value of the output clock signal CLK and the reference clock characteristic value of the reference clock signal CKr to correct the frequency error/accuracy of the output clock signal CLK caused by a temperature variation. How the controller 920 generates the control signal Sc can be referred to descriptions related to the control circuit 130 in FIG. 1.

Figure 14:
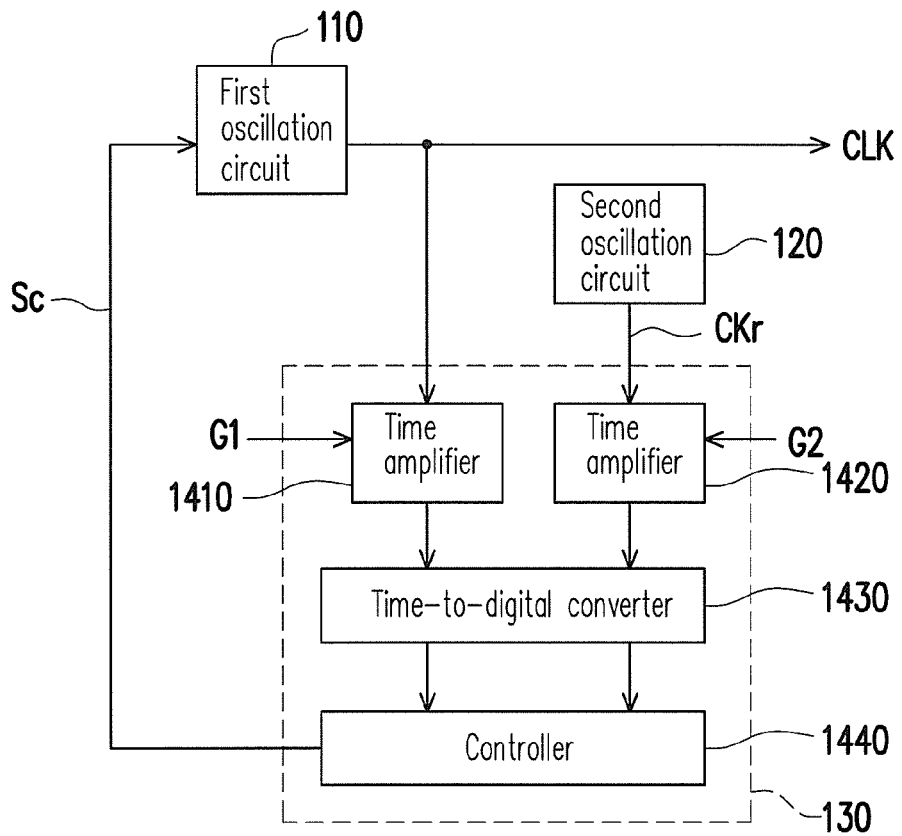
FIG. 14 is a circuit block diagram of a CLCG according to an embodiment of the present disclosure.

FIG. 14 is a circuit block diagram of a CLCG 1400 according to an embodiment of the present disclosure. The CLCG 1400 illustrated in FIG. 14 can be referred to descriptions related to the CLCG 100 illustrated in FIG. 1 or the CLCG 900 illustrated in FIG. 9. Unlike that in the embodiment illustrated in FIG. 9, in the embodiment illustrated in FIG. 14, the control circuit 130 includes a first time amplifier (TA) 1410, a second TA 1420, a time-to-digital converter (TDC) 1430, and a controller 1440. The TDC 1430 and the controller 1440 can be referred to descriptions related to the TDC 910 and the controller 920 in FIG. 9. The input terminal of the first TA 1410 is coupled to the output terminal of the first oscillation circuit 110. The input terminal of the second TA 1420 is coupled to the output terminal of the second oscillation circuit 120.

Figure 15:
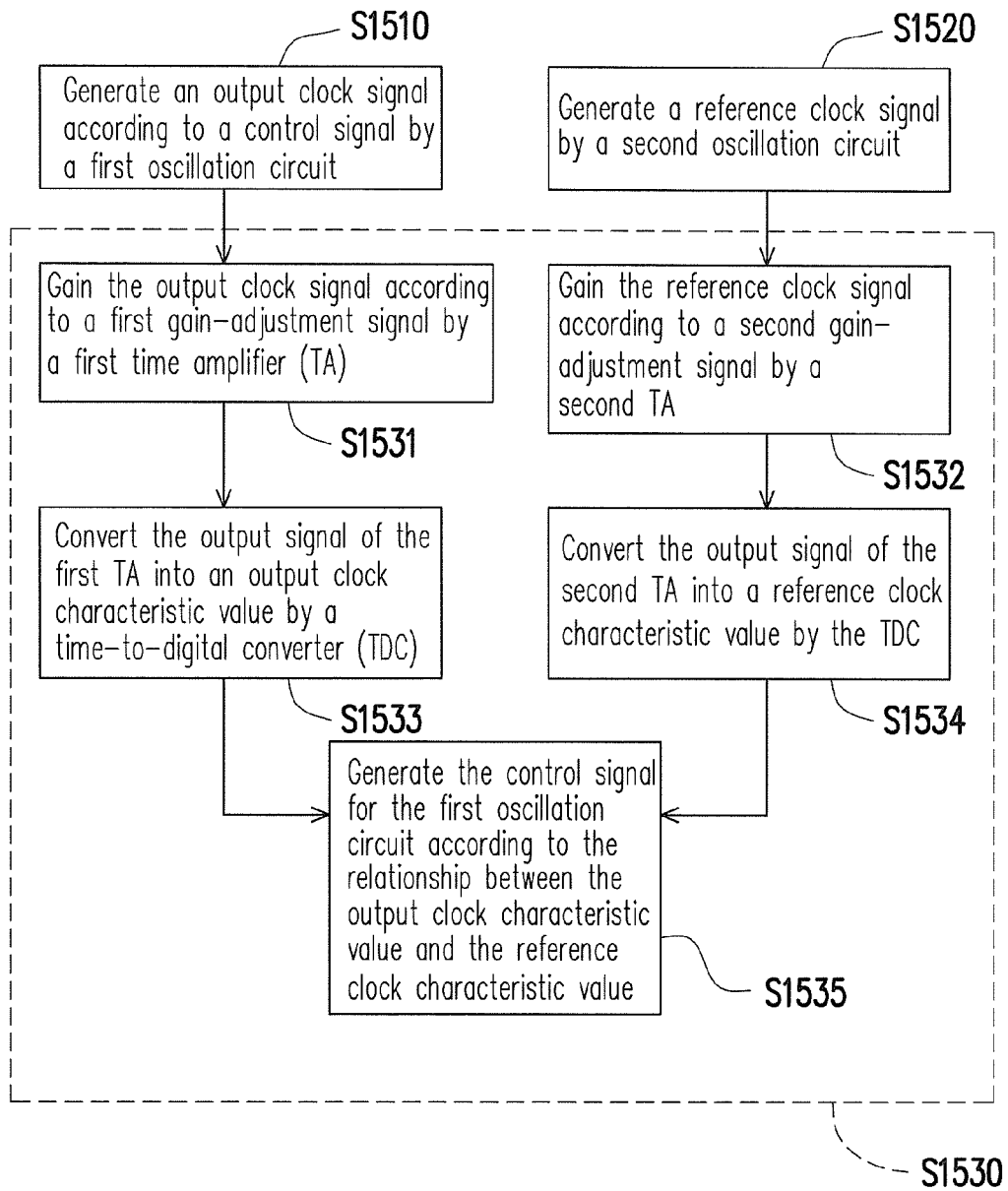
FIG. 15 is a flowchart of an operation method of a CLCG according to still another embodiment of the present disclosure.

FIG. 15 is a flowchart of an operation method of a CLCG according to still another embodiment of the present disclosure. Steps S1510, S1520, and S1530 in FIG. 15 can be referred to descriptions related to steps S210, S220, and S230 in FIG. 2 or to descriptions related to steps S1010, S1020, and S1030 in FIG. 10. Referring to FIG. 14 and FIG. 15, step S1530 further includes sub-steps S1531, S1532, S1533, S1534, and S1535. In step S1531, the first TA 1410 amplifies the time of the output clock signal CLK according to a first gain-adjustment signal G1 and outputs the amplified output clock signal CLK to the TDC 1430, where the gain of the first TA 1410 is controlled by the first gain-adjustment signal G1. In step S1532, the second TA 1420 amplifies the time of the reference clock signal CKr according to a second gain-adjustment signal G2 and outputs the amplified reference clock signal CKr to the TDC 1430, where the gain of the second TA 1420 is controlled by the second gain-adjustment signal G2. The first gain-adjustment signal G1 and/or the second gain-adjustment signal G2 can be determined according to the process drift.

Figure 16:
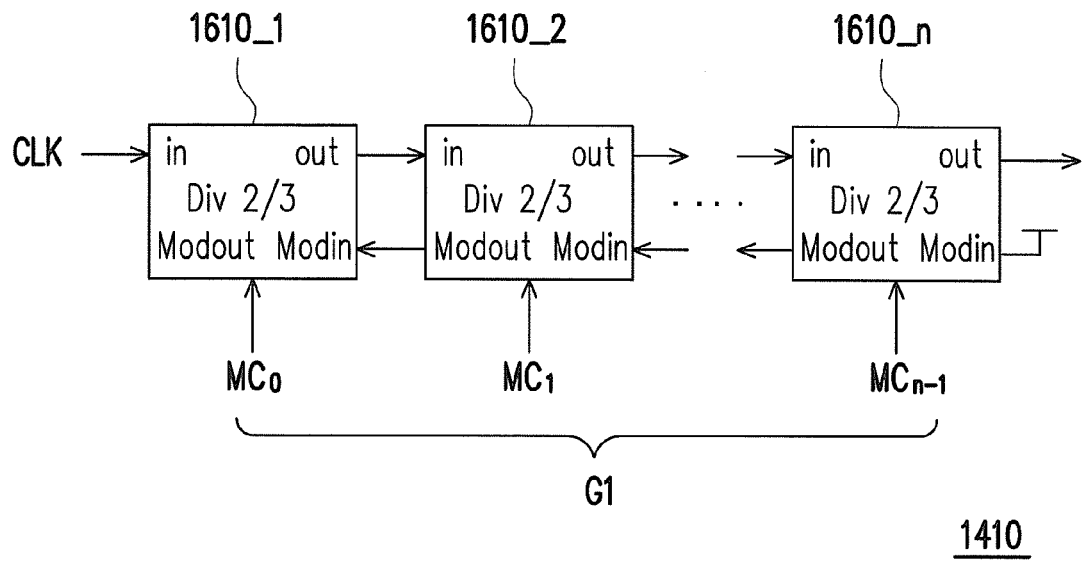
FIG. 16 is a circuit block diagram of a first time amplifier (TA) in FIG. 14 according to an embodiment of the present disclosure.

The first gain-adjustment signal G1 and/or the second gain-adjustment signal G2 can be implemented with any technique. FIG. 16 is a circuit block diagram of the first TA 1410 in FIG. 14 according to an embodiment of the present disclosure. The implementation of the second TA 1420 can be referred to descriptions related to the first TA 1410. Referring to FIG. 16, the first TA 1410 is a multi-modulus TA. The first TA 1410 includes n modulus circuits (frequency divider circuits) 1610_1, 1610_2, ..., and 1610_n. For example, the modulus circuits 1610_1-1610_n are divide-by-2 or divide-by-3 frequency divider circuits. The frequency dividing factor of the modulus circuits 1610_1-1610_n are controlled by the first gain-adjustment signal G1. In the present embodiment, the first gain-adjustment signal G1 includes bits $MC_0$, $MC_1$, ..., and $MC_{n-1}$ for respectively controlling the frequency dividing factor of the modulus circuits 1610_1-1610_n. Taking the modulus circuit 1610_1 as an example, when the bit $MC_0$ is logic 0, the modulus circuit 1610_1 is a divide-by-2 frequency divider circuit, and when the bit $MC_0$ is logic 1, the modulus circuit 1610_1 is a divide-by-3 frequency divider circuit.

The modulus circuits 1610_1-1610_n are connected with each other in series, as shown in FIG. 16. The input terminal in of the modulus circuit 1610_1 receives the output clock signal CLK, and the output terminal out of the modulus circuit 1610_n generates the amplified output clock signal CLK for the TDC 1430. When a temperature variation occurs, the frequency of the first oscillation circuit 110 changes with the temperature. In this case, the output period difference of the first oscillation circuit 110 caused by the temperature variation is amplified by the first TA 1410, and the amplified time width is then sent to the TDC 1430 to be analyzed. The function of the first TA 1410 in the entire system is as shown in FIG. 17.

Figure 17:
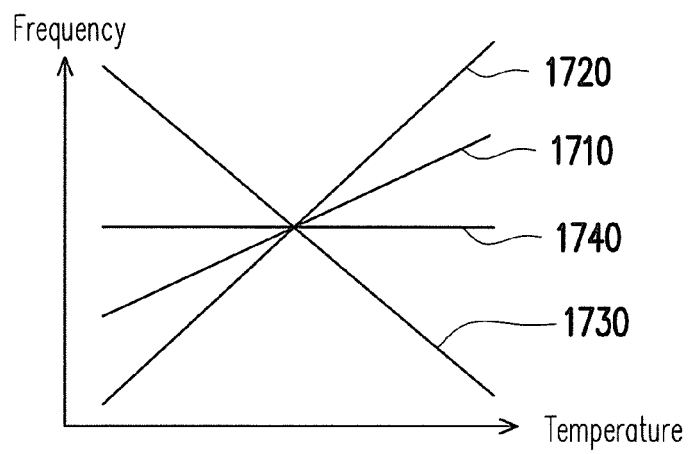
FIG. 17 is a diagram illustrating the temperature-frequency relationship in the CLCG in FIG. 14 according to an embodiment of the present disclosure.

FIG. 17 is a diagram illustrating the temperature-frequency relationship in the CLCG 1400 in FIG. 14 according to an embodiment of the present disclosure. In FIG. 17, different gain selections are illustrated, and the temperature compensation system curves illustrated in FIG. 17 represent different slope changes. For example, if the first gain-adjustment signal G1 (or the gain of the first TA 1410) is 4, the temperature-frequency relationship of the amplified output clock signal CLK is indicated by the curve 1710. If the first gain-adjustment signal G1 (or the gain of the first TA 1410) is 5, the temperature-frequency relationship of the amplified output clock signal CLK is indicated by the curve 1720. The second TA 1420 has similar operations. The TA 1410 and/or 1420 can further adjust the slope of the compensated frequency along with process variations, so as to achieve a stable output frequency in the changing temperature.

Referring to FIG. 14 and FIG. 15, the TDC 1430 is coupled to the output terminal of the first TA 1410 to convert the output signal of the first TA 1410 into an output clock characteristic value of the output clock signal CLK (step S1533). The TDC 1430 is also coupled to the output terminal of the second TA 1420 to convert the output signal of the second TA 1420 into a reference clock characteristic value of the reference clock signal CKr (step S1534). The controller 1440 is coupled to the output terminal of the TDC 1430. The controller 1440 generates the control signal Sc for the first oscillation circuit 110 according to the relationship between the output clock characteristic value of the output clock signal CLK and the reference clock characteristic value of the reference clock signal CKr to correct the frequency error/accuracy of the output clock signal CLK caused by the temperature variation (step S1535).

As shown in FIG. 17, it is assumed that the first gain-adjustment signal G1 (or the gain of the first TA 1410) is 5 (i.e., the temperature-frequency relationship of the amplified output clock signal CLK is indicated by the curve 1720). Equivalently, the controller 1440 generates the compensation curve 1730 in FIG. 17 according to the relationship between the output clock signal CLK and the reference clock signal CKr. Thus, the compensation curve 1730 can compensate the frequency error/accuracy (as indicated by the curve 1720) caused by the temperature variation, so that the temperature-frequency relationship of the compensated output clock signal CLK of the first oscillation circuit 110 is as indicated by the curve 1740.

Figure 18:
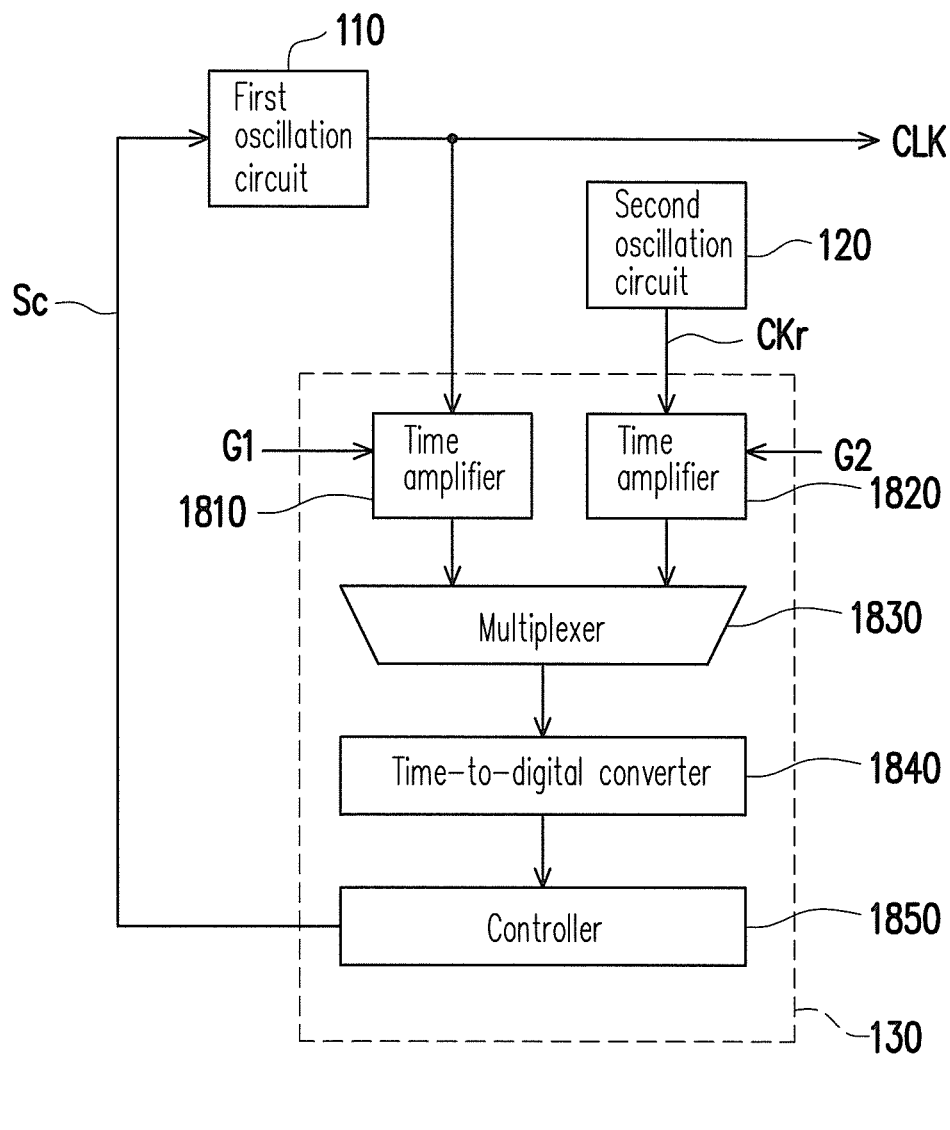
FIG. 18 is a circuit block diagram of a CLCG according to an embodiment of the present disclosure.

FIG. 18 is a circuit block diagram of a CLCG 1800 according to an embodiment of the present disclosure. The CLCG 1800 illustrated in FIG. 18 can be referred to descriptions related to the CLCG 100 illustrated in FIG. 1 or the CLCG 1400 illustrated in FIG. 14. Unlike that in the embodiment illustrated in FIG. 14, in the embodiment illustrated in FIG. 18, the control circuit 130 includes a first TA 1810, a second TA 1820, a multiplexer 1830, a time-to-digital converter (TDC) 1840, and a controller 1850. The first TA 1810, the second TA 1820, the TDC 1840, and the controller 1850 can be referred to descriptions related to the first TA 1410, the second TA 1420, the TDC 1430, and the controller 1440 in FIG. 14.

The input terminal of the first TA 1810 is coupled to the output terminal of the first oscillation circuit 110. The input terminal of the second TA 1820 is coupled to the output terminal of the second oscillation circuit 120. The first input terminal of the multiplexer 1830 is coupled to the output terminal of the first TA 1810. The second input terminal of the multiplexer 1830 is coupled to the output terminal of the second TA 1820. The input terminal of the TDC 1840 is coupled to the output terminal of the multiplexer 1830. The multiplexer 1830 selectively pass the output of the first TA 1810 or the second TA 1820 to the TDC 1840. The TDC 1840 alternatively converts the output signal of the first TA 1810 into an output clock characteristic value and converts the output signal of the second TA 1820 into a reference clock characteristic value.

The controller 1850 is coupled to the output terminal of the TDC 1840. The controller 1850 generates the control signal Sc for the first oscillation circuit 110 according to the relationship between the output clock characteristic value of the output clock signal CLK and the reference clock characteristic value of the reference clock signal CKr to correct the frequency error/accuracy of the output clock signal CLK caused by the temperature variation. How the controller 1850 generates the control signal Sc can be referred to descriptions related to the control circuit 130 in FIG. 1.

Figure 19:
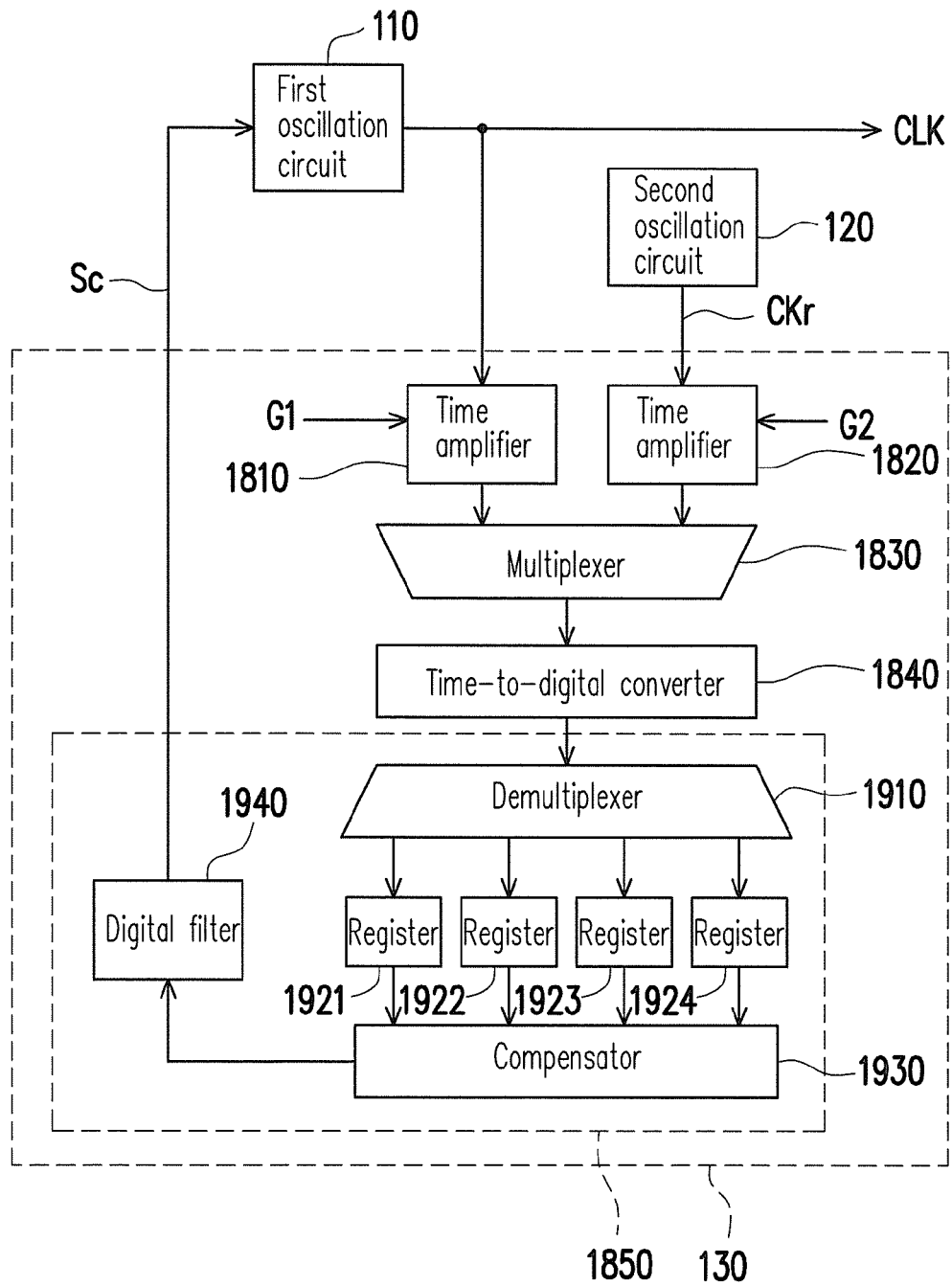
FIG. 19 is a circuit block diagram of a CLCG according to an embodiment of the present disclosure.

FIG. 19 is a circuit block diagram of a CLCG 1900 according to an embodiment of the present disclosure. The CLCG 1900 illustrated in FIG. 19 can be referred to the CLCG 100 illustrated in FIG. 1 or the CLCG 1800 illustrated in FIG. 18. Unlike that in the embodiment illustrated in FIG. 18, in the embodiment illustrated in FIG. 19, the controller 1850 includes a demultiplexer 1910, a first register 1921, a second register 1922, a third register 1923, a fourth register 1924, a compensator 1930, and a digital filter 1940. The first TA 1810, the second TA 1820, the multiplexer 1830, and the TDC 1840 can be referred to descriptions related to the first TA 1810, the second TA 1820, the multiplexer 1830, and the TDC 1840 in FIG. 18.

The input terminal of the demultiplexer 1910 is coupled to the output terminal of the TDC 1840. The first register 1921 is coupled to the first output terminal of the demultiplexer 1910 for recording a first reference frequency. The second register 1922 is coupled to the second output terminal of the demultiplexer 1910 for recording a second reference frequency. The third register 1923 is coupled to the third output terminal of the demultiplexer 1910 for recording the current output clock characteristic value of the output clock signal CLK. The fourth register 1924 is coupled to the fourth output terminal of the demultiplexer 1910 for recording the current reference clock characteristic value of the reference clock signal CKr.

At the initial temperature, the TDC 1840 converts the output clock signal CLK of the first oscillation circuit 110 into a digital code and records the digital code related to the output clock signal CLK into the first register 1921 through the demultiplexer 1910 as the first reference frequency. At this initial temperature, the TDC 1840 also converts the reference clock signal CKr of the second oscillation circuit 120 into a digital code and records this digital code related to the reference clock signal CKr into the second register 1922 through the demultiplexer 1910 as the second reference frequency.

During the operation, the temperature of the CLCG 1900 may change. The temperature variation causes the frequencies of the first oscillation circuit 110 and the second oscillation circuit 120 to drift. The TDC 1840 converts the output clock signal CLK of the first oscillation circuit 110 into a digital code at the current temperature and records the digital code related to the output clock signal CLK into the third register 1923 through the demultiplexer 1910 as the output clock characteristic value. The TDC 1840 also converts the reference clock signal CKr of the second oscillation circuit 120 into a digital code at the current temperature and records the digital code related to the reference clock signal CKr into the fourth register 1924 through the demultiplexer 1910 as the reference clock characteristic value.

The compensator 1930 is coupled to the first register 1921, the second register 1922, the third register 1923, and the fourth register 1924. The compensator 1930 generates the control signal Sc according to the contents of the first register 1921, the second register 1922, the third register 1923, and the fourth register 1924. For example, in the present embodiment, the compensator 1930 calculates the difference (referred to as a first difference) between the output clock characteristic value recorded in the third register 1923 and the first reference frequency recorded in the first register 1921 and calculates the difference (referred to as a second difference) between the reference clock characteristic value recorded in the fourth register 1924 and the second reference frequency recorded in the second register 1922. The compensator 1930 generates the control signal Sc based on the relationship between the first difference and the second difference. When the temperature of the CLCG 1900 changes, the contents in the third register 1923 and the fourth register 1924 change with the temperature. During the operation, the compensator 1930 constantly monitors the relationship between the first difference and the second difference and adjusts the control signal Sc accordingly until the first difference is equal to the second difference. In other embodiments, the first difference and the second difference are respectively multiplied by a first weight and a second weight, and the compensator 1930 constantly monitors the relationship between the first difference and the second difference and adjusts the control signal Sc accordingly until the product of the first difference and the first weight is equal to the product of the second difference and the second weight.

Figure 20:
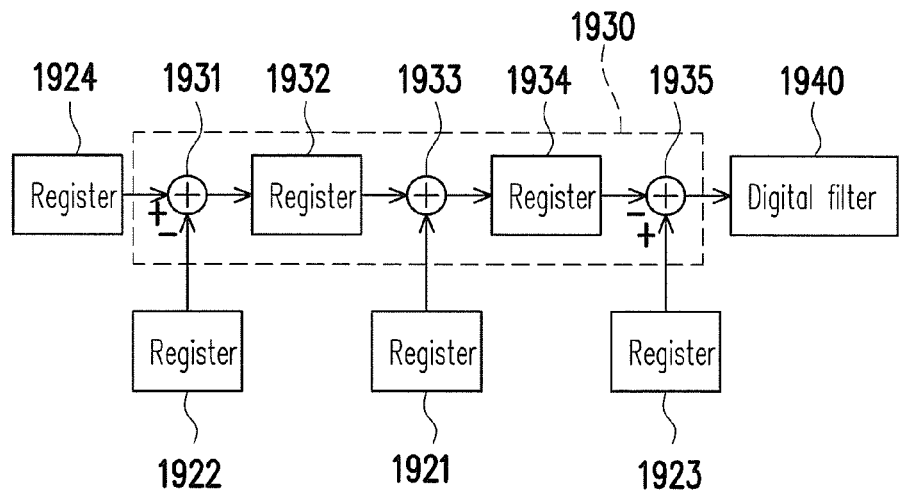
FIG. 20 is a circuit block diagram of a compensator in FIG. 19 according to an embodiment of the present disclosure.

In the present embodiment, the compensator 1930 can be implemented with any technique. FIG. 20 is a circuit block diagram of the compensator 1930 in FIG. 19 according to an embodiment of the present disclosure. The compensator 1930 includes a first subtractor 1931, a fifth register 1932, an adder 1933, a sixth register 1934, and a second subtractor 1935. The first subtractor 1931 is coupled to the second register 1922 and the fourth register 1924. The first subtractor 1931 calculates and outputs the difference (i.e., the second difference) between the contents of the second register 1922 and the fourth register 1924. The fifth register 1932 is coupled to the output terminal of the first subtractor 1931 for recording the second difference output by the first subtractor 1931. The adder 1933 is coupled to the first register 1921 and the fifth register 1932. The adder 1933 calculates and outputs the sum of the contents of the first register 1921 and the fifth register 1932. The sixth register 1934 is coupled to the output terminal of the adder 1933 for recording the output of the adder 1933. The second subtractor 1935 is coupled to the third register 1923 and the sixth register 1934. The second subtractor 1935 calculates the difference between the contents of the third register 1923 and the sixth register 1934 and outputs the difference as the control signal Sc to the digital filter 1940.

Referring to FIG. 19, the digital filter 1940 is coupled to the compensator 1930. The digital filter 1940 receives and accumulates the operation result output by the compensator 1930 to obtain an accumulation result. The digital filter 1940 also generates an appropriate digital control code (i.e., the control signal Sc) for a digital oscillator (i.e., the first oscillation circuit 110) according to the stability requirement of the system loop and the accumulation result, so as to determine/ modulate the oscillation frequency of the output clock signal CLK. The digital filter 1940 filters the control signal Sc generated by the compensator 1930 and transmits the filtered control signal Sc to the first oscillation circuit 110. In the present embodiment, the digital filter 1940 can be implemented with any technique. For example, the digital filter 1940 can be realized by using a digital loop filter (DLF).

Figure 21:
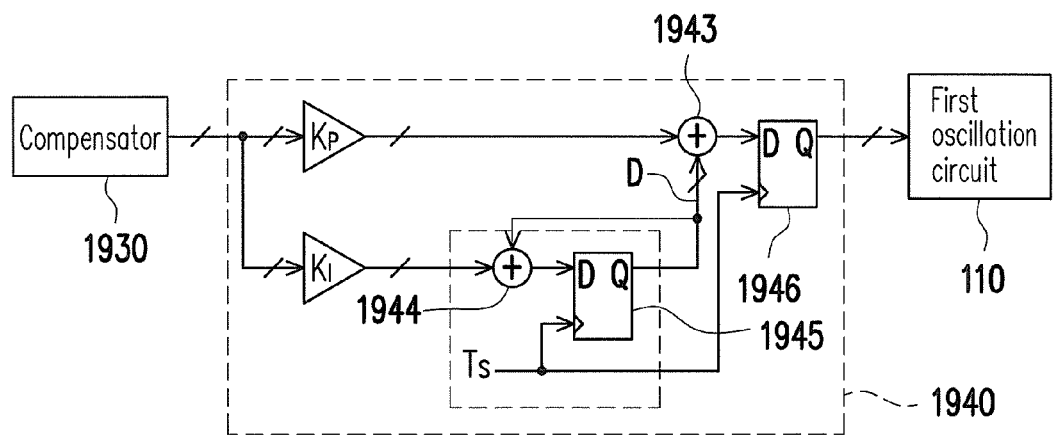
FIG. 21 is a circuit block diagram of a digital filter in FIG. 19 according to an embodiment of the present disclosure.

FIG. 21 is a circuit block diagram of the digital filter 1940 in FIG. 19 according to an embodiment of the present disclosure. The digital filter 1940 includes an amplifier $K_P$, an amplifier $K_I$, an adder 1943, an adder 1944, a flip-flop 1945, and a flip-flop 1946. The amplifier $K_P$ and the amplifier $K_I$ respectively shift the operation result of the compensator 1930. The adder 1943 is coupled to the output terminal of the amplifier $K_P$ and the output terminal of the flip-flop 1945. The adder 1943 calculates and outputs the sum of the output of the amplifier $K_P$ and the output signal D of the flip-flop 1945. Two input terminals of the adder 1944 are respectively coupled to the output terminal of the amplifier $K_I$ and the output terminal of the flip-flop 1945. The adder 1944 calculates and outputs the sum of the output of the amplifier $K_I$ and the output signal D of the flip-flop 1945. The input terminal of the flip-flop 1945 is coupled to the output terminal of the adder 1944, and the trigger terminal of the flip-flop 1945 is coupled to a sample signal Ts. The adder 1944 and the flip-flop 1945 constitute an accumulative circuit such that the output of the amplifier $K_I$ can be accumulated according to the timing of the sample signal Ts. Through the shifting operations of the amplifier $K_P$ and the amplifier $K_I$, the output signal D of the flip-flop 1945 is sent back to the adder 1944 to be accumulated and is stored in the flip-flop 1945.

The output signal D of the flip-flop 1945 is sent to the adder 1943 to be added to the output of the amplifier $K_P$. The input terminal of the flip-flop 1946 is coupled to the output terminal of the adder 1943, the trigger terminal of the flip-flop 1945 is coupled to the sample signal Ts, and the output terminal of the flip-flop 1946 outputs the filtered control signal Sc to the first oscillation circuit 110. The sample signal Ts may be a signal obtained by dividing the frequency of the output clock signal CLK of the first oscillation circuit 110. The flip-flop 1946 synchronizes the output signal with the sample signal and eliminates any glitch produced by the adder 1943. Based on the relationship between the first difference and the second difference calculated by the compensator 1930, the digital filter 1940 accumulates the operation result of the compensator 1930 and constantly adjusts the control signal Sc accordingly until the first difference is equal to the second difference (i.e., until the operation result of the compensator 1930 is 0).

Thus, the digital filter 1940 can accumulate the operation result output by the compensator 1930 and generate an appropriate control signal Sc for the first oscillation circuit 110 according to the stability requirement of the system loop and the accumulation result, so as to modulate the oscillation frequency of the output clock signal CLK accordingly. Herein the sampling frequency and the digital filter modulation signal (Kp and Ki) affect the overall loop stability.

Figure 22:
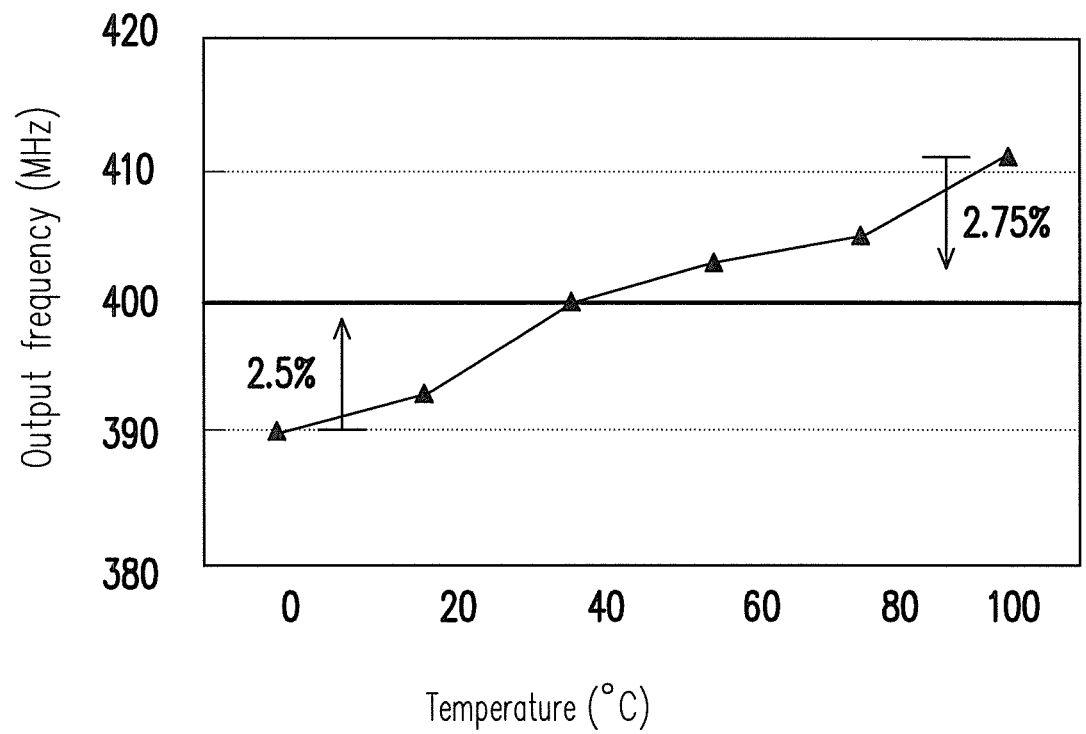
FIG. 22 is a graph illustrating the temperature-output frequency relationship in the CLCG in FIG. 19 according to an embodiment of the present disclosure.

FIG. 22 is a graph illustrating the temperature-output frequency relationship in the CLCG 1900 in FIG. 19 according to an embodiment of the present disclosure. In FIG. 22, the ordinate indicates the frequency of the output clock signal CLK of the first oscillation circuit 110, and the abscissa indicates the temperature of the CLCG 1900. Herein the simulation condition is that the first gain-adjustment signal G1 has a fixed value and the second gain-adjustment signal G2 has a fixed value. FIG. 22 illustrates the simulated frequency error of the output clock signal CLK when the temperature variation is 0° C.-100° C. Herein it is assumed that the operating voltage of the CLCG 1900 is 0.5 V, and with a typical-typical (TT) process and a temperature of 25° C., the power consumption of the CLCG 1900 is 1.2 mW. The simulation result of the frequency accuracy with a temperature variation is shown. The frequency accuracy is within ±3%.

Figure 23:
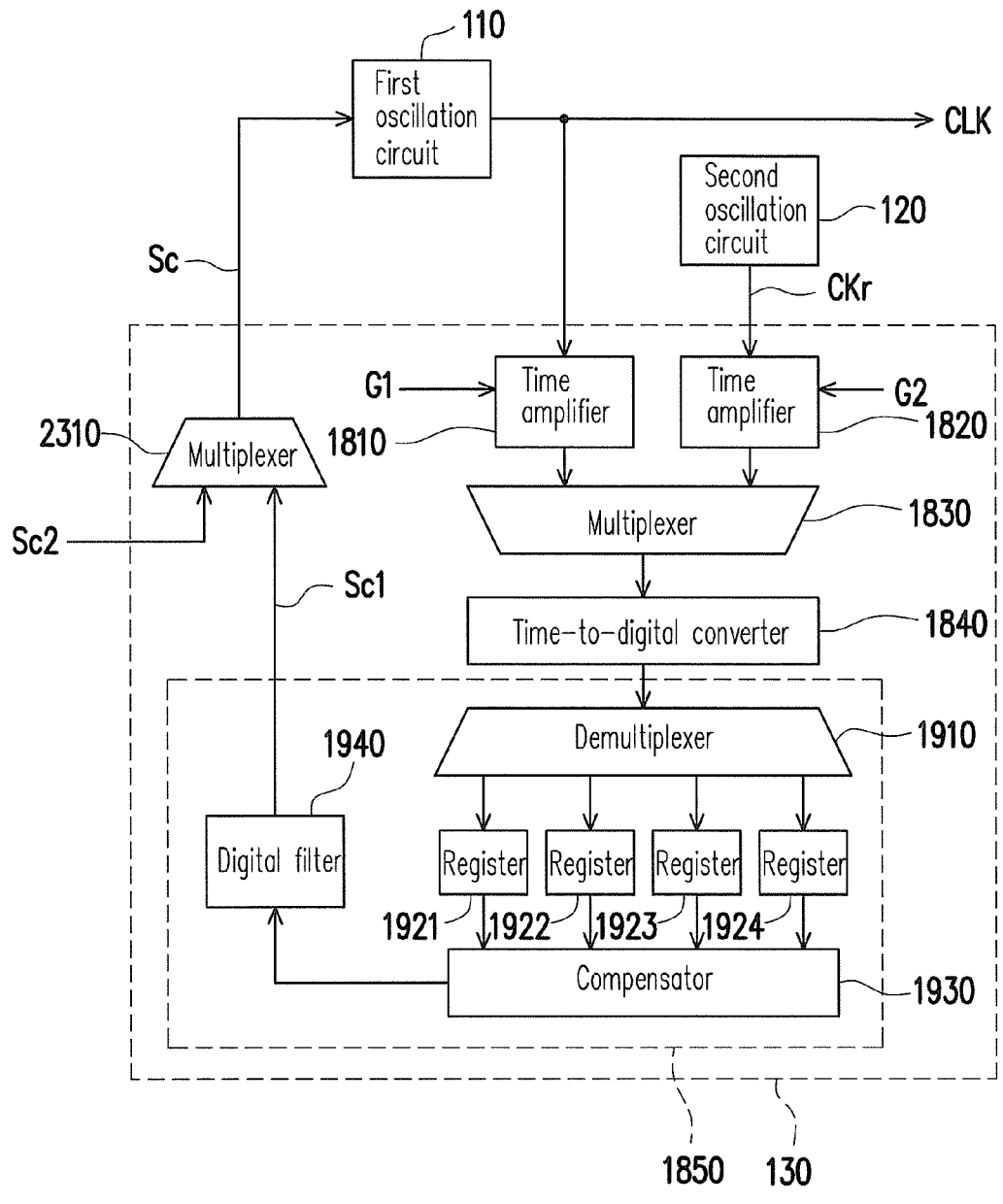
FIG. 23 is a circuit block diagram of a CLCG according to an embodiment of the present disclosure.

FIG. 23 is a circuit block diagram of a CLCG 2300 according to an embodiment of the present disclosure. The CLCG 2300 illustrated in FIG. 23 can be referred to descriptions related to the CLCG 100 illustrated in FIG. 1 or the CLCG 1900 illustrated in FIG. 19, therefore will not be described herein. Unlike that in the embodiment illustrated in FIG. 19, in the embodiment illustrated in FIG. 23, the control circuit 130 further includes a multiplexer 2310. The first input terminal of the multiplexer 2310 is coupled to the output terminal of the controller 1850 for receiving the control signal Sc1, the second input terminal of the multiplexer 2310 receives the external control signal Sc2, and the output terminal of the multiplexer 2310 is coupled to the first oscillation circuit 110. The multiplexer 2310 selectively pass the control signal Sc1 or the external control signal Sc2 to the first oscillation circuit 110 as the control signal Sc.

During the initialization of the CLCG 2300, the multiplexer 2310 pass the external control signal Sc2 to the first oscillation circuit 110 as the control signal Sc. Thus, the CLCG 2300 can be calibrated through the external control signal Sc2, so as to adjust the output clock signal CLK of the first oscillation circuit 110 to have the system target frequency. This technique can adjust the frequency drift of a chip caused by process drift. After the CLCG 2300 is initialized, the multiplexer 2310 pass the control signal Sc1 output by the controller 1850 to the first oscillation circuit 110 as the control signal Sc. Herein the temperature compensation mechanism of the control circuit 130 is enabled. The temperature compensation mechanism of the control circuit 130 has been described in detail in foregoing embodiments, therefore will not be described herein.

As described above, in the embodiments described above, a system-target operating frequency can be set up at a normal temperature. After that, the operating frequency is dynamically compensated through the temperature compensation mechanism of the control circuit 130, so as to calibrate the operating frequency of the system. When the temperature changes, the control circuit 130 detects any change in the output frequencies of the first oscillation circuit 110 and the second oscillation circuit 120 and converts the output clock signal CLK and the reference clock signal CKr into digital values by a time-to-digital converter (TDC). Next, the control circuit 130 performs a calculation on the digital values and sends the calculation result into a digital filter, so as to calibrate the frequency of the first oscillation circuit 110. Additionally, in some embodiments, a TA is disposed before the TDC. The TA can further adjust the slope of the compensated frequency according to any process variation, so as to achieve a stable output frequency at a changing temperature. The first oscillation circuit 110 may provide a multi-phase output clock signal.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A crystal-less clock generator (CLCG), comprising:
a first oscillation circuit, controlled by a control signal for generating an output clock signal of the CLCG;
a second oscillation circuit, generating a reference clock signal; and
a control circuit, coupled to the first oscillation circuit for receiving the output clock signal, and coupled to the second oscillation circuit for receiving the reference clock signal, wherein the control circuit is used to generate the control signal for the first oscillation circuit,
wherein the control circuit calculates a first difference between a frequency of the output clock signal and a first reference frequency, calculates a second difference between a frequency of the reference clock signal and a second reference frequency, and generates the control signal for the first oscillation circuit according to a relationship between the first difference and the second difference,
wherein the control circuit takes a frequency of the output clock signal measured after the first oscillation circuit is initialized to serve as the first reference frequency, and takes a frequency of the reference clock signal measured after the second oscillation circuit is initialized to serve as the second reference frequency.

2. The CLCG according to claim 1, wherein the control circuit adjusts the control signal until the first difference is equal to the second difference.

3. The CLCG according to claim 1, wherein the control circuit adjusts the control signal until a product of the first difference and a first weight is equal to a product of the second difference and a second weight.

4. The CLCG according to claim 1, wherein the control circuit takes the frequency of the output clock signal measured for a first time after the first oscillation circuit is initialized to serve as the first reference frequency, and takes the frequency of the reference clock signal measured for a first time after the second oscillation circuit is initialized to serve as the second reference frequency.

5. The CLCG according to claim 1, wherein the first oscillation circuit comprises a digital controlled oscillator.

6. The CLCG according to claim 1, wherein the first oscillation circuit comprises:
a main loop, comprising a plurality of main loop inverters coupled with each other, wherein at least one of the main loop inverters is controlled by the control signal, and an output terminal of one of the main loop inverters generates the output clock signal.

7. The CLCG according to claim 6, wherein the first oscillation circuit further comprises:
at least one secondary loop inverter, wherein an input terminal of the at least one secondary loop inverter is coupled to an output terminal of an $i^{th}$ main loop inverter among the main loop inverters, and an output terminal of the at least one secondary loop inverter is coupled to an input terminal of an $(i-1)^{th}$ main loop inverter among the main loop inverters, wherein i is an integer, and an output terminal of the $(i-1)^{th}$ main loop inverter is coupled to an input terminal of the $i^{th}$ main loop inverter.

8. The CLCG according to claim 7, wherein the secondary loop inverter is controlled by the control signal.

9. The CLCG according to claim 6, wherein the control signal comprises a coarse-tuning signal and a fine-tuning signal, at least one of the main loop inverters is controlled by the coarse-tuning signal, and the first oscillation circuit further comprises:
at least one varactor, coupled to the output terminal of one of the main loop inverters, wherein the at least one varactor is controlled by the fine-tuning signal.

10. The CLCG according to claim 1, wherein the first oscillation circuit comprises:
N main loop inverters $MLI_1$-$MLI_N$, wherein an input terminal of the main loop inverter $MLI_1$ is coupled to an output terminal of the main loop inverter $MLI_N$, and an input terminal of the main loop inverter $MLI_i$ is coupled to an output terminal of the main loop inverter $MLI_{i-1}$, wherein N is an integer, i is an integer between 1 and N, at least one of the main loop inverters $MLI_1$-$MLI_N$ is controlled by the control signal, and an output terminal of one of the main loop inverters $MLI_1$-$MLI_N$ generates the output clock signal of the CLCG.

11. The CLCG according to claim 10, wherein the first oscillation circuit further comprises:
N secondary loop inverters $SLI_1$-$SLI_N$, wherein an input terminal of the secondary loop inverter $SLI_i$ is coupled to an output terminal of the main loop inverter $MLI_{i+1}$, and an output terminal of the secondary loop inverter $SLI_i$ is coupled to the input terminal of the main loop inverter $MLI_i$.

12. The CLCG according to claim 10, wherein the control signal comprises a coarse-tuning signal and a fine-tuning signal, at least one of the main loop inverters $MLI_1$-$MLI_N$ is controlled by the coarse-tuning signal, and the first oscillation circuit further comprises:
K varactors $VC_1$-$VC_K$, wherein a varactor $VC_i$ among the varactors $VC_1$-$VC_K$ is coupled to an output terminal of the main loop inverter $MLI_i$, wherein K is an integer, and the varactors $VC_1$-$VC_K$ are controlled by the fine-tuning signal.

13. The CLCG according to claim 1, wherein a circuit structure of the second oscillation circuit is the same as a circuit structure of the first oscillation circuit.

14. The CLCG according to claim 1, wherein the second oscillation circuit comprises a ring oscillator.

15. The CLCG according to claim 1, wherein the control circuit comprises:
a time-to-digital converter (TDC), coupled to the first oscillation circuit and the second oscillation circuit, wherein the TDC converts the output clock signal into an output clock characteristic value and converts the reference clock signal into a reference clock characteristic value; and
a controller, coupled to an output terminal of the TDC, wherein the controller generates the control signal for the first oscillation circuit according to a relationship between the output clock characteristic value and the reference clock characteristic value.

16. The CLCG according to claim 1, wherein the control circuit correct a frequency error or a frequency accuracy of the output clock signal caused by an environmental variation by adjusting the control signal according to the relationship between the output clock signal and the reference clock signal, and the environmental variation comprises a temperature variation, a voltage variation, or a process variation.

17. A crystal-less clock generator (CLCG), comprising:
a first oscillation circuit, controlled by a control signal for generating an output clock signal of the CLCG;
a second oscillation circuit, generating a reference clock signal; and
a control circuit, coupled to the first oscillation circuit for receiving the output clock signal, and coupled to the second oscillation circuit for receiving the reference clock signal, wherein the control circuit is used to generate the control signal for the first oscillation circuit according to a relationship between the output clock signal and the reference clock signal, wherein the control circuit comprises:
a first time amplifier (TA), wherein an input terminal of the first TA is coupled to an output terminal of the first oscillation circuit, and a gain of the first TA is controlled by a first gain-adjustment signal;
a second TA, wherein an input terminal of the second TA is coupled to an output terminal of the second oscillation circuit, and a gain of the second TA is controlled by a second gain-adjustment signal;
a time-to-digital converter (TDC), coupled to the first TA to convert at least one output signal of the first TA into an output clock characteristic value, and coupled to the second TA to convert at least one output signal of the second TA into a reference clock characteristic value; and
a controller, coupled to the TDC, wherein the controller generates the control signal for the first oscillation circuit according to a relationship between the output clock characteristic value and the reference clock characteristic value.

18. The CLCG according to claim 17, wherein the control circuit further comprises:
a first multiplexer, wherein a first input terminal of the first multiplexer is coupled to an output terminal of the first TA, and a second input terminal of the first multiplexer is coupled to an output terminal of the second TA;
wherein the time-to-digital converter (TDC), coupled to an output terminal of the first multiplexer to convert the at least one output signal of the first TA into the output clock characteristic value and convert the at least one output signal of the second TA into the reference clock characteristic value.

19. The CLCG according to claim 18, wherein the control circuit further comprises:
a second multiplexer, wherein a first input terminal of the second multiplexer is coupled to an output terminal of the controller to receive the control signal, a second input terminal of the second multiplexer receives an external control signal, and an output terminal of the second multiplexer is coupled to the first oscillation circuit to pass the control signal or the external control signal to the first oscillation circuit.

20. The CLCG according to claim 18, wherein the controller comprises:
a demultiplexer, wherein an input terminal of the demultiplexer is coupled to an output terminal of the TDC;
a first register, coupled to a first output terminal of the demultiplexer, and recording a first reference frequency;
a second register, coupled to a second output terminal of the demultiplexer, and recording a second reference frequency;
a third register, coupled to a third output terminal of the demultiplexer, and recording the output clock characteristic value;
a fourth register, coupled to a fourth output terminal of the demultiplexer, and recording the reference clock characteristic value;
a compensator, coupled to the first register, the second register, the third register, and the fourth register, and generating an operation result according to contents of the first register, the second register, the third register, and the fourth register; and
a digital filter, coupled to the compensator, and generating the control signal for the first oscillation circuit according to the operation result of the compensator.

21. The CLCG according to claim 20, wherein the compensator comprises:
a first subtractor, coupled to the second register and the fourth register, and calculating and outputting a difference between the content of the second register and the content of the fourth register;
a fifth register, coupled to an output terminal of the first subtractor, and recording an output of the first subtractor;
an adder, coupled to the first register and the fifth register, and calculating and outputting a sum of the content of the first register and a content of the fifth register;
a sixth register, coupled to an output terminal of the adder, and recording an output of the adder; and
a second subtractor, coupled to the third register and the sixth register, and calculating and outputting a difference between the content of the third register and a content of the sixth register as the operation result.

22. An operation method of a crystal-less clock generator (CLCG), comprising:
generating an output clock signal of the CLCG according to a control signal by a first oscillation circuit;
generating a reference clock signal by a second oscillation circuit;
calculating a first difference between a frequency of the output clock signal and a first reference frequency;
calculating a second difference between a frequency of the reference clock signal and a second reference frequency;
generating the control signal for the first oscillation circuit according to a relationship between the first difference and the second difference;
taking a frequency of the output clock signal measured after the first oscillation circuit is initialized to serve as the first reference frequency; and
taking a frequency of the reference clock signal measured after the second oscillation circuit is initialized to serve as the second reference frequency.

23. The operation method according to claim 22, wherein the step of generating the control signal according to the relationship between the first difference and the second difference comprises:
adjusting the control signal until the first difference is equal to the second difference.

24. The operation method according to claim 22, wherein the step of generating the control signal according to the relationship between the first difference and the second difference comprises:
adjusting the control signal until a product of the first difference and a first weight is equal to a product of the second difference and a second weight.

25. The operation method according to claim 22 further comprising:
taking the frequency of the output clock signal measured for a first time after the first oscillation circuit is initialized to serve as the first reference frequency; and taking the frequency of the reference clock signal measured for a first time after the second oscillation circuit is initialized to serve as the second reference frequency.

26. The operation method according to claim 22, wherein the first oscillation circuit comprises a digital controlled oscillator (DCO).

27. The operation method according to claim 22, wherein a circuit structure of the second oscillation circuit is the same as a circuit structure of the first oscillation circuit.

28. The operation method according to claim 22, wherein the second oscillation circuit comprises a ring oscillator.

29. The operation method according to claim 22, wherein the step of generating the control signal comprises:
   converting the output clock signal into an output clock characteristic value by a time-to-digital converter (TDC);
   converting the reference clock signal into a reference clock characteristic value by the TDC; and
   generating the control signal for the first oscillation circuit according to a relationship between the output clock characteristic value and the reference clock characteristic value.

30. The operation method according to claim 22, wherein the step of generating the control signal comprises:
   amplifying the output clock signal according to a first gain-adjustment signal by a first time amplifier (TA);
   amplifying reference clock signal according to a second gain-adjustment signal by a second TA;
   converting at least one output signal of the first TA into an output clock characteristic value by a time-to-digital converter (TDC);
   converting at least one output signal of the second TA into a reference clock characteristic value by the TDC; and
   generating the control signal for the first oscillation circuit according to a relationship between the output clock characteristic value and the reference clock characteristic value.

31. The operation method according to claim 22, wherein a frequency error or a frequency accuracy of the output clock signal caused by an environmental variation is corrected by adjusting the control signal according to the relationship between the output clock signal and the reference clock signal, and the environmental variation comprises temperature variation, voltage variation, or process variation.

* * * * *